US012635223B2

(12) United States Patent
Chen et al.

(10) Patent No.: US 12,635,223 B2
(45) Date of Patent: May 19, 2026

(54) METHOD FOR FORMING SEMICONDUCTOR DEVICE

(71) Applicant: TAIWAN SEMICONDUCTOR MANUFACTURING COMPANY, LTD., Hsinchu (TW)

(72) Inventors: Chin-Ta Chen, Hsinchu City (TW); Han-Wei Wu, Tainan City (TW); Yuan-Hsiang Lung, Hsinchu City (TW); Hua-Tai Lin, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 622 days.

(21) Appl. No.: 18/153,304

(22) Filed: Jan. 11, 2023

(65) Prior Publication Data

US 2024/0105518 A1     Mar. 28, 2024

Related U.S. Application Data

(60) Provisional application No. 63/377,053, filed on Sep. 26, 2022.

(51) Int. Cl.
| | |
|---|---|
| *H10D 84/03* | (2025.01) |
| *H01L 21/308* | (2006.01) |
| *H10D 84/01* | (2025.01) |
| *H10D 84/83* | (2025.01) |

(52) U.S. Cl.
CPC ....... *H10D 84/038* (2025.01); *H01L 21/3086* (2013.01); *H10D 84/0158* (2025.01); *H10D 84/834* (2025.01)

(58) Field of Classification Search
CPC ........... H10D 84/0158; H10D 84/1093; H10D 84/834; H10D 84/853; H10D 84/0151; H10D 84/0188; H01L 21/0334; H01L 21/0337; H01L 21/3086
See application file for complete search history.

(56) References Cited

U.S. PATENT DOCUMENTS

2017/0069504 A1* 3/2017 Li .......................... H01L 21/461

FOREIGN PATENT DOCUMENTS

JP            2004342765 A  * 12/2004

* cited by examiner

*Primary Examiner* — Tuan A Hoang
(74) *Attorney, Agent, or Firm* — Maschoff Brennan

(57) ABSTRACT

A first group of semiconductor fins are over a first region of a substrate, the substrate includes a first stepped profile between two of the first group of semiconductor fins, and the first stepped profile comprises a first lower step, two first upper steps, and two first step rises extending from opposite sides of the first lower step to the first upper steps. A second group of semiconductor fins are over a second region of the substrate, the substrate includes a second stepped profile between two of the second group of semiconductor fins, and the second stepped profile comprises a second lower step, two second upper steps, and two second step rises extending from opposite sides of the second lower step to the second upper steps, in which the second upper steps are wider than the first upper steps in the cross-sectional view.

20 Claims, 41 Drawing Sheets

METHOD FOR FORMING SEMICONDUCTOR DEVICE

PRIORITY CLAIM AND CROSS-REFERENCE

The present application claims priority to U.S. Provisional Application Ser. No. 63/377,053, filed Sep. 26, 2022, which is herein incorporated by reference.

BACKGROUND

The integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A to 15B illustrate a method in various stages of forming a semiconductor device in accordance with some embodiments of the present disclosure.

DETAILED DESCRIPTION

Figures 1A, 1B:
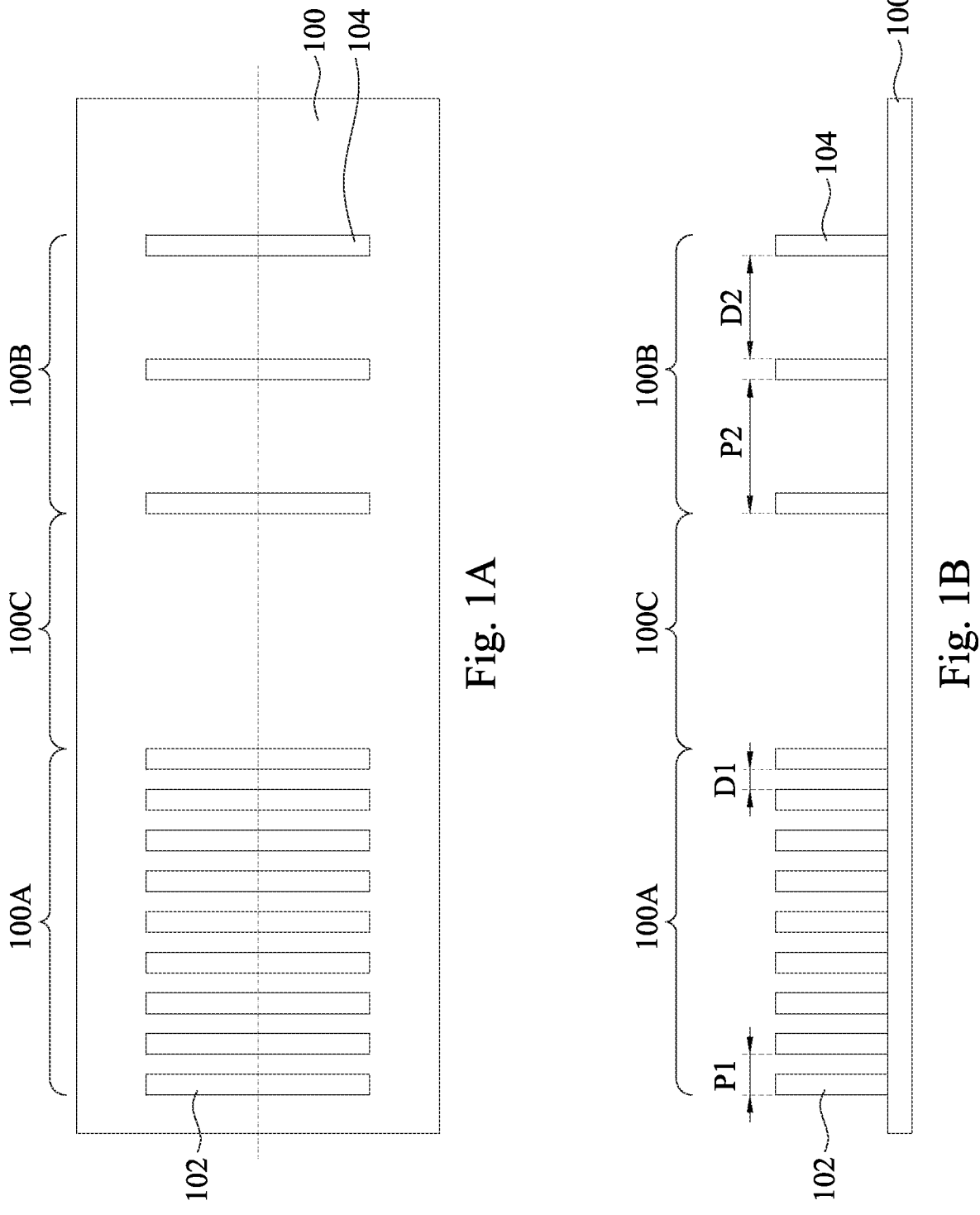

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1A to 14B illustrate a method in various stages of forming a semiconductor device in accordance with some embodiments of the present disclosure. Although the method described in FIGS. 1A to 14B is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

Reference is made to FIGS. 1A and 1B, in which FIG. 1A is a top view of a semiconductor device, and FIG. 1B is a cross-sectional along line B-B of FIG. 1A. Shown there is a substrate 100. The substrate 100 may be made of silicon or other semiconductor materials. Alternatively or additionally, the substrate 100 may include other elementary semiconductor materials such as germanium. In some embodiments, the substrate 100 is made of a compound semiconductor such as silicon carbide (SiC), gallium arsenic (GaAs), indium arsenide (InAs), or indium phosphide (InP). In some embodiments, the substrate 100 is made of an alloy semiconductor such as silicon germanium (SiGe), silicon germanium carbide (SiGeC), gallium arsenic phosphide (GaAsP), or gallium indium phosphide (GaInP). In some embodiments, the substrate 100 includes an epitaxial layer. For example, the substrate 100 has an epitaxial layer overlying a bulk semiconductor.

A first group of first semiconductor fins 102 is formed over a first region 100A of the substrate 100 and a second group of second semiconductor fins 104 is formed over a second region 100B of the substrate 100. In some embodiments, the density of first semiconductor fins 102 in the first group is greater than the density of second semiconductor fins 104 in the second group. For example, a distance D1 between two adjacent first semiconductor fins 102 is smaller than a distance D2 between two adjacent second semiconductor fins 104. Stated another way, a fin pitch P1 of the first semiconductor fins 102 in the first group is smaller than a fin pitch P2 of the second semiconductor fins 104 in the second group. In some embodiments, the fin pitch P1 of the first semiconductor fins 102 in the first group is in a range from about 18 nm to about 55 nm. In some embodiments, due to the higher fin density, a number of the first semiconductor fins 102 in the first group may be greater than a number of the semiconductor fins 104 in the second group, while the present disclosure is not limited thereto. In some embodiments, the density of first semiconductor fins 102 is in a range from about 50% to about 90%, and the density of second semiconductor fins 104 is in a range from about 10% to about 50%.

The substrate 100 may include a third region 100C that is between the first region 100A and the second region 100B of the substrate 100. In some embodiments, the third region 100C may be an empty region. That is, the third region 100C of the substrate 100 is free of semiconductor fins (e.g., the first and second semiconductor fins 102 and 104). Accordingly, the third region 100C can also be referred to as a fin-free region.

In some embodiments, the first semiconductor fins 102 and the second semiconductor fins 104 may be formed by suitable photolithography process. For example, in some embodiments, a patterned photoresist may be formed over the substrate 100. The patterned photoresist may include openings that expose portions of the substrate 100. An etching process is performed to remove the exposed portions of the substrate 100 through the openings of the patterned photoresist, so as to form the first semiconductor fins 102 and the second semiconductor fins 104. Afterwards, the patterned photoresist may be removed.

In other embodiments, a hard mask is formed over the substrate 100. The hard mask may include a pad layer and a mask layer over the pad layer (not shown). The pad layer may be a thin film including silicon oxide formed using, for example, a thermal oxidation process. The pad layer may act as an adhesion layer between the substrate 100 and mask layer. The mask layer is formed from silicon nitride, for example, by using LPCVD or PECVD. The hard mask is patterned to form openings that expose portions of the substrate 100. An etching process is performed to remove the exposed portions of the substrate 100 through the openings of the patterned hard mask. After the etching process, the hard mask may include remaining portions over the top surface of each of the first semiconductor fins 102 and the second semiconductor fins 104.

Figures 2A, 2B:
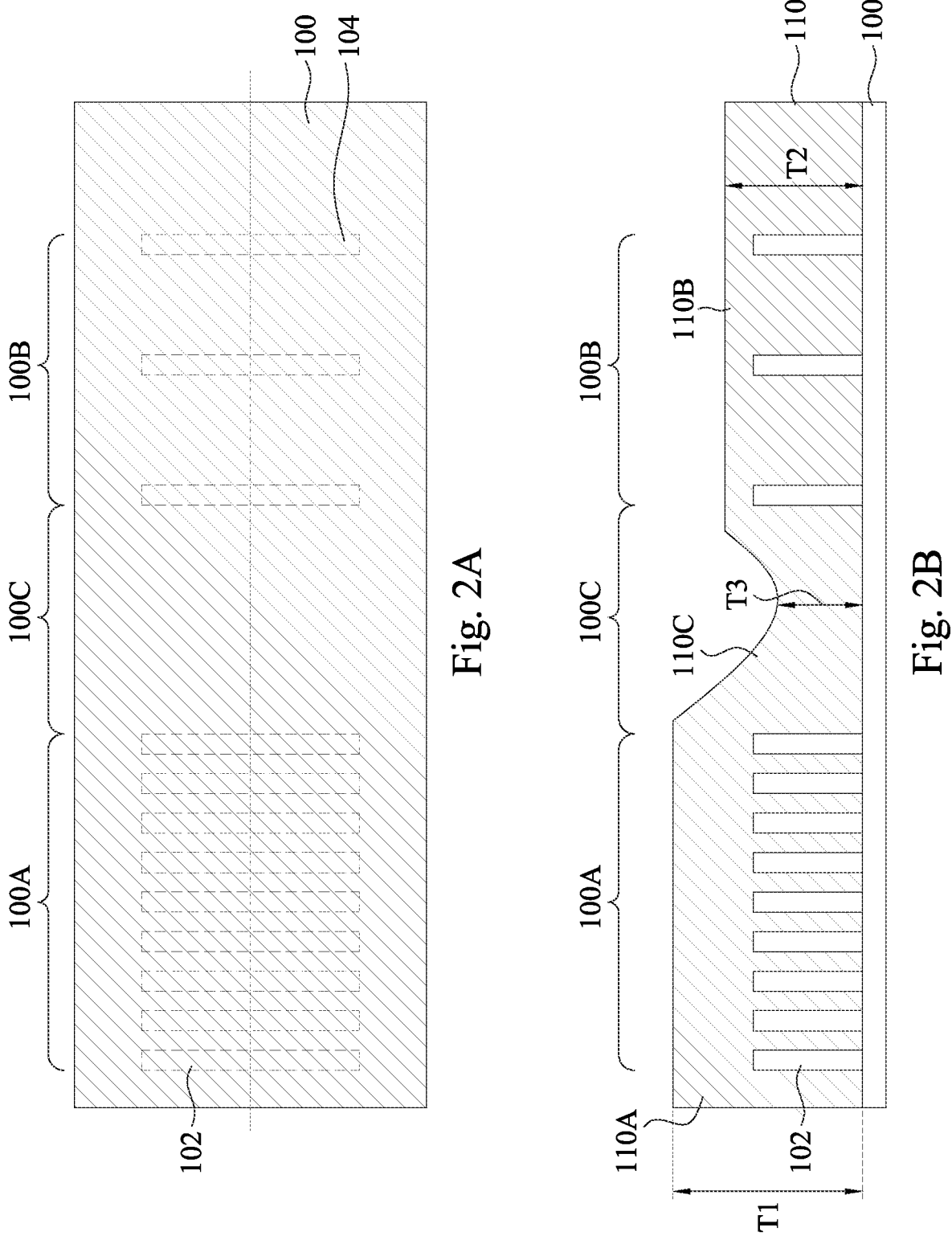

Reference is made to FIGS. 2A and 2B, in which FIG. 2A is a top view of a semiconductor device, and FIG. 2B is a cross-sectional along line B-B of FIG. 2A. A mask layer 110 is formed over the substrate 100 and covering the first semiconductor fins 102 and the second semiconductor fins 104. In some embodiments, the mask layer 110 may include a first portion 110A over the first portion 100A of the substrate 100 and covering the first semiconductor fins 102. The mask layer 110 may include a second portion 110B over the second portion 100B of the substrate 100 and covering the second semiconductor fins 104. Moreover, the mask layer 110 may include a third portion 110C over the third portion 100C of the substrate 100. In some embodiments, the first portion 110A of the mask layer 110 may include a thickness T1, and the second portion 110B of the mask layer 110 may include a thickness T2, in which the thickness T1 is greater than the thickness T2. This is because the first semiconductor fins 102 have higher pattern density than the second semiconductor fins 104, and thus the material of the mask layer 110 may be filled in the trenches between the first semiconductor fins 102 with a faster rate than filled in the trenches between the second semiconductor fins 104. In some embodiments, the first portion 110A and the second portion 110B of the mask layer 110 may include substantially flat top surface.

On the other hand, the third portion 110C of the mask layer 110 may include a varied thickness. For example, along the direction from the first region 100A of the substrate 100 to the second region 100B of the substrate 100, the thickness of the third portion 110C may decrease from a thickness T1 to a smallest thickness T3, and then increase to a thickness T2. That is, because the third portion 110C of the mask layer 110 is connected to the first portion 110A and the second portion 110B of the mask layer 110, a first side of the third portion 110C that is connected to the first portion 110A may include the same thickness T1 as the first portion 110A, and a second side of the third portion 110C that is connected to the second portion 110B may include the same thickness T2 as the second portion 110B. In some embodiments, the thickness T3 is smaller than the thicknesses T1 and T2. This is because the third region 100C of the substrate 100 is a region without fins (e.g., the first and second semiconductor fins 102, 104), and thus the material of the mask layer 110 may be filled in the third region 100C of the substrate 100 with a lower deposition rate. In some embodiments, the thickness variation of the third portion 110C of the mask layer 110 is greater than the thickness variations of the first portion 110A and the second portion 110B of the mask layer 110. In some embodiments, the third portion 110C of the mask layer 110 has a concave top surface. In some embodiments, the top surfaces of the first portion 110A and the second portion 110B of the mask layer 110 are flatter than the top surface of the third portion 110C of the mask layer 110. Stated another way, the top surface of the third portion 110C of the mask layer 110 is more curved than the top surfaces of the first portion 110A and the second portion 110B of the mask layer 110. In some embodiments, the thicknesses T1, T2, and T3 of the mask layer 110 can also be referred to as heights T1, T2, and T3 of the mask layer 110.

In some embodiments, the thickness T1 is in a range from about 500 Å to about 2000 Å. In some embodiments, the thickness T2 is in a range from about 400 Å to about 2000 Å. In some embodiments, the thickness T3 is in a range from about 300 Å to about 2000 Å.

In some embodiments, the mask layer 110 may be a photoresist layer. In some embodiments, the photoresist layer may be formed by spinning, spray coating, or other applicable techniques. The photoresist layer may include a light sensitive material such that properties, such as solubility, of the photoresist layer are affected by light. In some embodiments, the photoresist layer is a negative photoresist. With respect to a negative photoresist, regions of the negative photoresist become insoluble when illuminated by a light source such that application of a solvent to the negative photoresist during a subsequent development stage removes non-illuminated regions of the negative photoresist. A pattern formed in the negative photoresist is thus a negative of a pattern defined by opaque regions of a template between the light source and the negative photoresist. In some embodiments, using a negative photoresist may be beneficial for forming the a tri-layer photoresist formed in later steps. This is because the negative photoresist material will be strengthened (either polymerized or cross-linked) by light.

In some embodiments, the photoresist layer includes a metallic material, a polymeric material as a matrix that is resistive, radiation-sensitive component (such as photo-acid generator (PAG)) that is reactive to the polymeric material, a quencher base, a chromophore, and/or a solvent. In some embodiments, the metallic material of the photoresist layer includes metal suboxide cations. In some embodiments, the metallic material of the photoresist layer includes a hafnium oxide hydroxide sulfate ($HafSO_x$) that has both high radiation absorption coefficient elements (i.e., hafnium) and radiation sensitive ligands (i.e., peroxo species) sensitive to extreme ultraviolet (EUV).

Figures 3A, 3B:
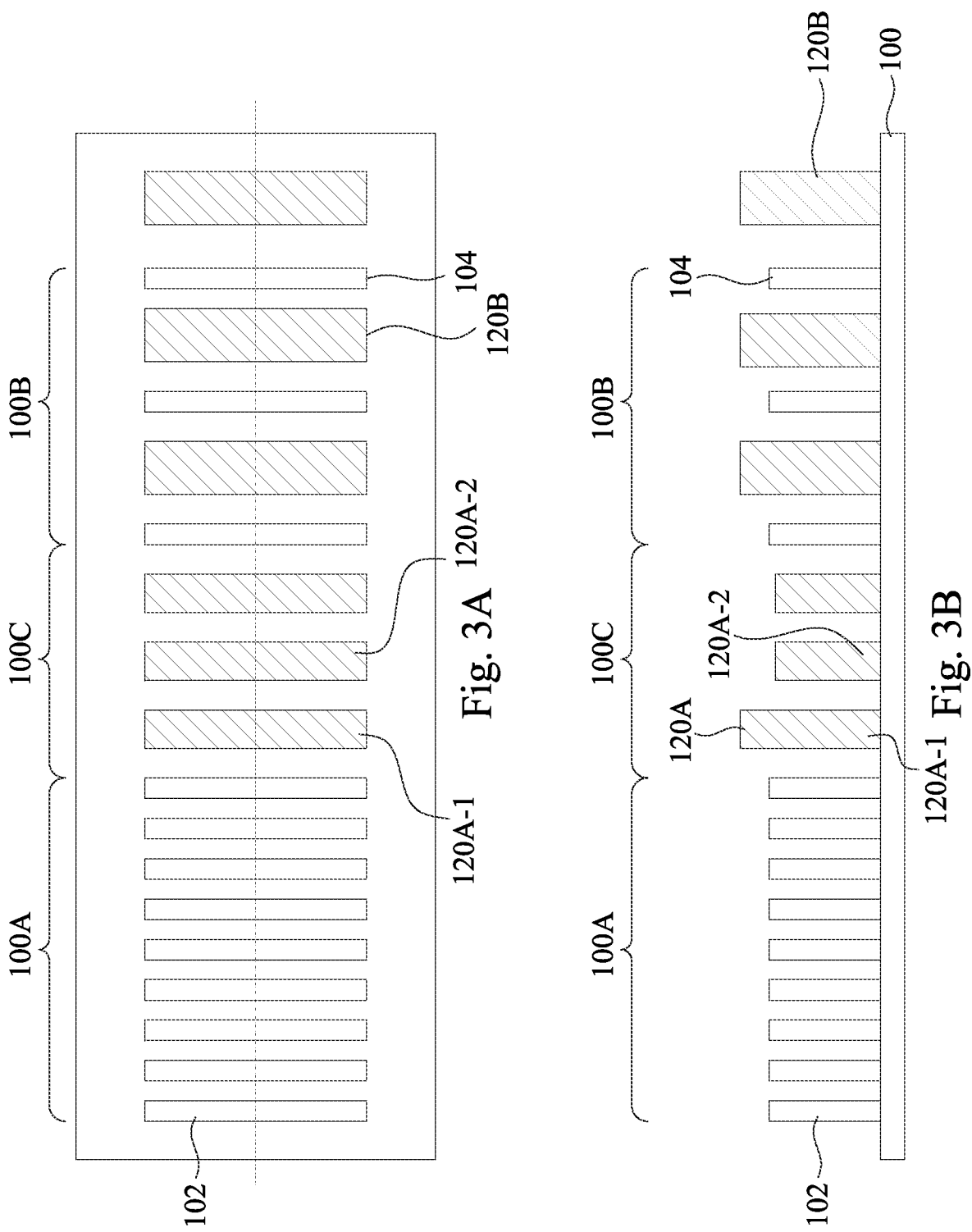

Reference is made to FIGS. 3A and 3B, in which FIG. 3A is a top view of a semiconductor device, and FIG. 3B is a cross-sectional along line B-B of FIG. 3A. The mask layer 110 (see FIGS. 2A and 2B) is patterned to form a group of mask strips 120A and a group of mask strips 120B. In some embodiments, the group of mask strips 120A is within the third region 100C of the substrate 100. That is, the mask strips 120A is between the group of the first semiconductor fins 102 and the group of the second semiconductor fins 104. On the other hand, the group of mask strips 120B is within the second region 100B of the substrate 100.

In some embodiments where the mask layer 110 is made of a negative photoresist material, regions of the negative photoresist become insoluble when illuminated by a light source such that application of a solvent to the negative photoresist during a subsequent development stage removes non-illuminated regions of the negative photoresist.

With respect to the mask strips 120A, the mask strips 120A may include a mask strip 120A-1 that is closest to the group of the first semiconductor fins 102, and may include mask strips 120A-2 other than the mask strip 120A-1. In some embodiments, the top surface of the mask strip 120A-1 is higher than the top surfaces of other mask strips 120A-2, which is resulted from the varied thickness of the third portion 110C of the mask layer 110 as described in FIGS. 2A and 2B. In some embodiments, the top surface of the mask strip 120A-1 is also higher than the top surfaces of the first semiconductor fins 102 and the second semiconductor fins 104. On the other hand, the top surfaces of other mask strips 120A-2 are lower than the top surfaces of the first semiconductor fins 102 and the second semiconductor fins 104. In some embodiments, the width of the mask strips 120A-2 is greater than the widths of the first semiconductor fins 102 and the second semiconductor fins 104.

With respect to the mask strips 120B, the mask strips 120B and the second semiconductor fins 104 are alternately along the lateral direction. That is, each of the mask strips 120B is formed between two adjacent second semiconductor fins 104. Stated another way, two adjacent mask strips 120B are laterally separated from one second semiconductor fin 104. In some embodiments, the top surfaces of the mask strips 120B are higher than the top surfaces of the first semiconductor fins 102 and the second semiconductor fins 104. Moreover, the top surfaces of the mask strips 120B are higher than the top surfaces of other mask strips 120A-2. In some embodiments, the top surfaces of the mask strips 120B are substantially level with the top surface of the mask strip 120A-1. In some embodiments, the width of the mask strips 120B is wider than the width of the mask strips 120A, and is wider than the widths of the first semiconductor fins 102 and the second semiconductor fins 104.

Figures 4A, 4B:
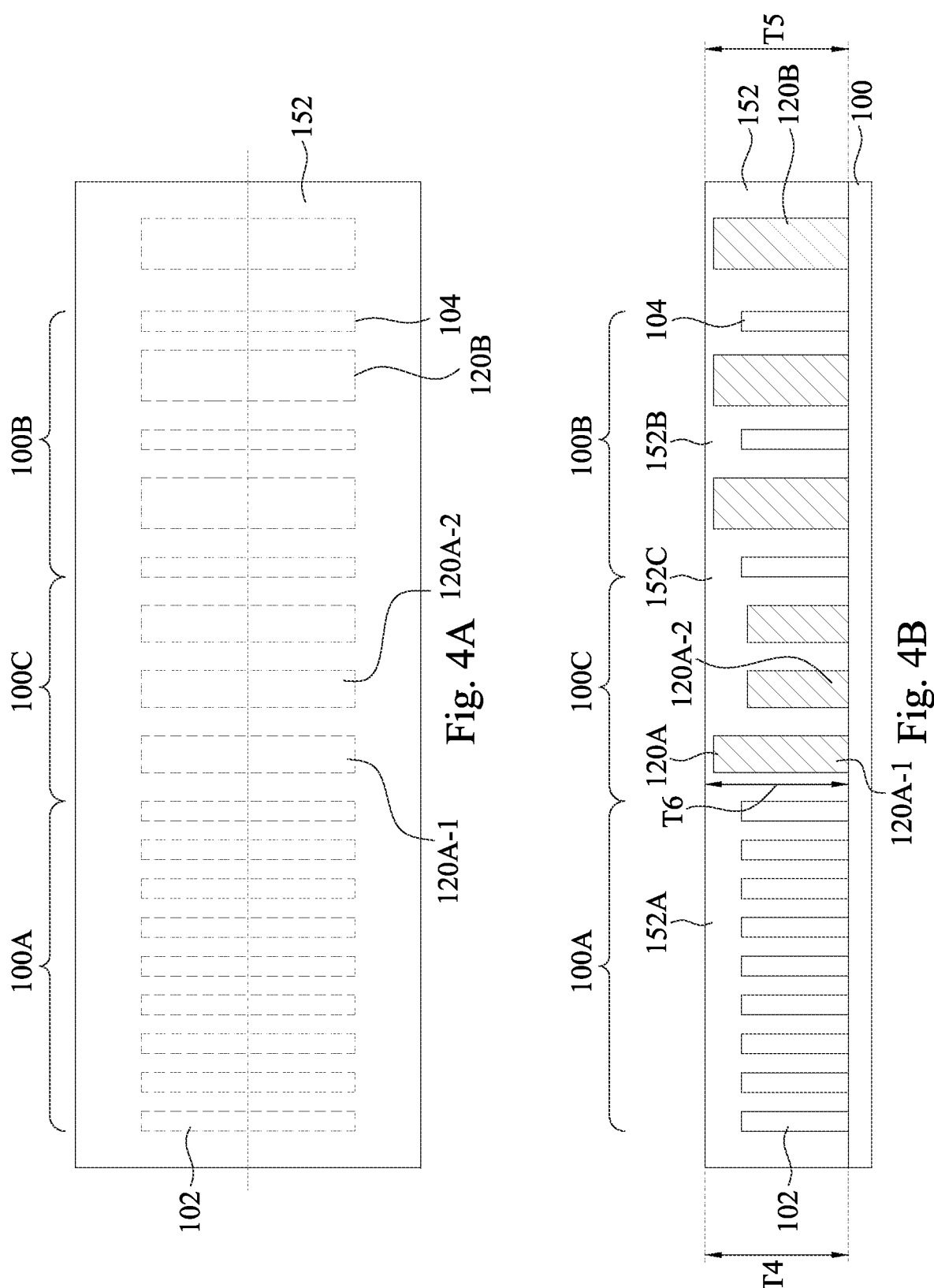

Reference is made to FIGS. 4A and 4B, in which FIG. 4A is a top view of a semiconductor device, and FIG. 4B is a cross-sectional along line B-B of FIG. 4A. A bottom layer 152 of a tri-layer photoresist (e.g., the tri-layer photoresist 150 of FIGS. 6A and 6B) is formed over the substrate 100. In some embodiments, the bottom layer 152 may include first, second, and third portions 152A, 152B, and 152C over the first, second, and third regions 100A, 100B, and 100C of the substrate 100. In greater details, the first portion 152A of the bottom layer 152 covers the first semiconductor fins 102. The second portion 152B of the bottom layer 152 covers the second semiconductor fins 104 and the mask strips 120B. The third portion 152C of the bottom layer 152 covers the mask strips 120A. That is, top surfaces and opposite sidewalls of the first semiconductor fins 102, the second semiconductor fins 104, the mask strips 120A, and the mask strips 120B may be in contact with the bottom layer 152.

The first, second, and third portions 152A, 152B, and 152C of the bottom layer 152 may include thicknesses T4, T5, and T6, respectively. In some embodiments, the thicknesses T4, T5, and T6 may be substantially the same. Accordingly, after the bottom layer 152 is formed, the bottom layer 152 may include a substantially flat top surface over the first, second, and third regions 100A, 100B, and 100C of the substrate 100. This is because the mask strips 120A and 120B may balance the pattern densities of the first, second, and third regions 100A, 100B, and 100C of the substrate 100, such that the deposition rate of the bottom layer 152 may be uniform over the first, second, and third regions 100A, 100B, and 100C of the substrate 100, which in turn will result in the bottom layer 152 having a uniform thickness over the substrate 100. However, if the mask strips 120A and 120B are absent, the pattern densities of the first, second, and third regions 100A, 100B, and 100C of the substrate 100 may be different, the bottom layer 152 may be formed with severe thickness variation, which will deteriorate the quality of the tri-layer photoresist (e.g., the tri-layer photoresist 150 of FIGS. 6A and 6B). In some embodiments, the thicknesses T4, T5, and T6 each may in a range from about 500 Å to about 10000 Å.

Figures 5A, 5B:
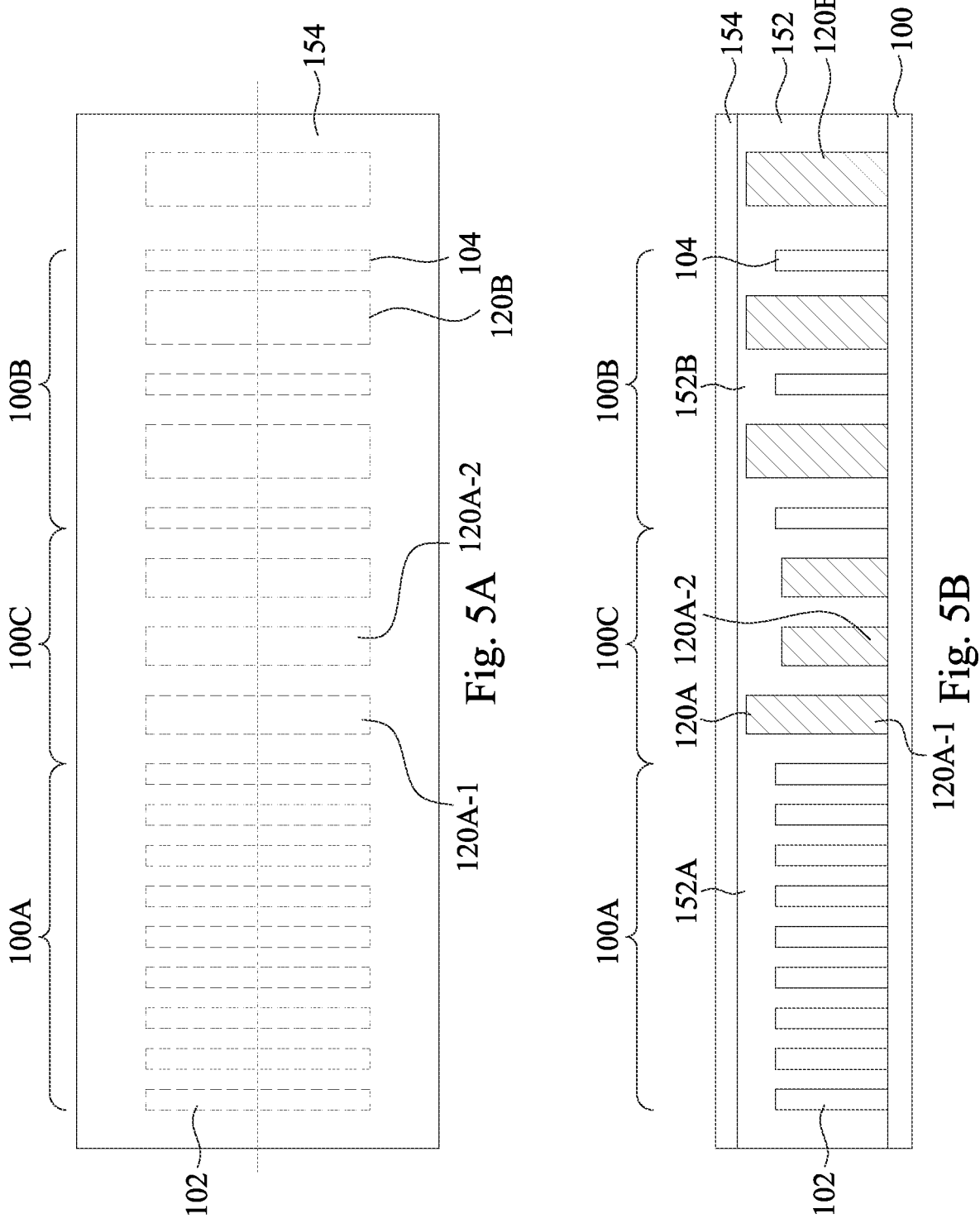

Reference is made to FIGS. 5A and 5B, in which FIG. 5A is a top view of a semiconductor device, and FIG. 5B is a cross-sectional along line B-B of FIG. 5A. A middle layer 154 of a tri-layer photoresist (e.g., the tri-layer photoresist 150 of FIGS. 6A and 6B) is formed over the bottom layer 152. In some embodiments, because the bottom layer 152 is formed with a substantially flat top surface, the middle layer 154 can be deposited over the bottom layer 152 with a uniform thickness, and thus the quality of the tri-layer photoresist (e.g., the tri-layer photoresist 150 of FIGS. 6A and 6B) is improved. In some embodiments, the middle layer 154 may include a uniform thickness in a range from about 50 Å to about 1000 Å.

Figures 6A, 6B:
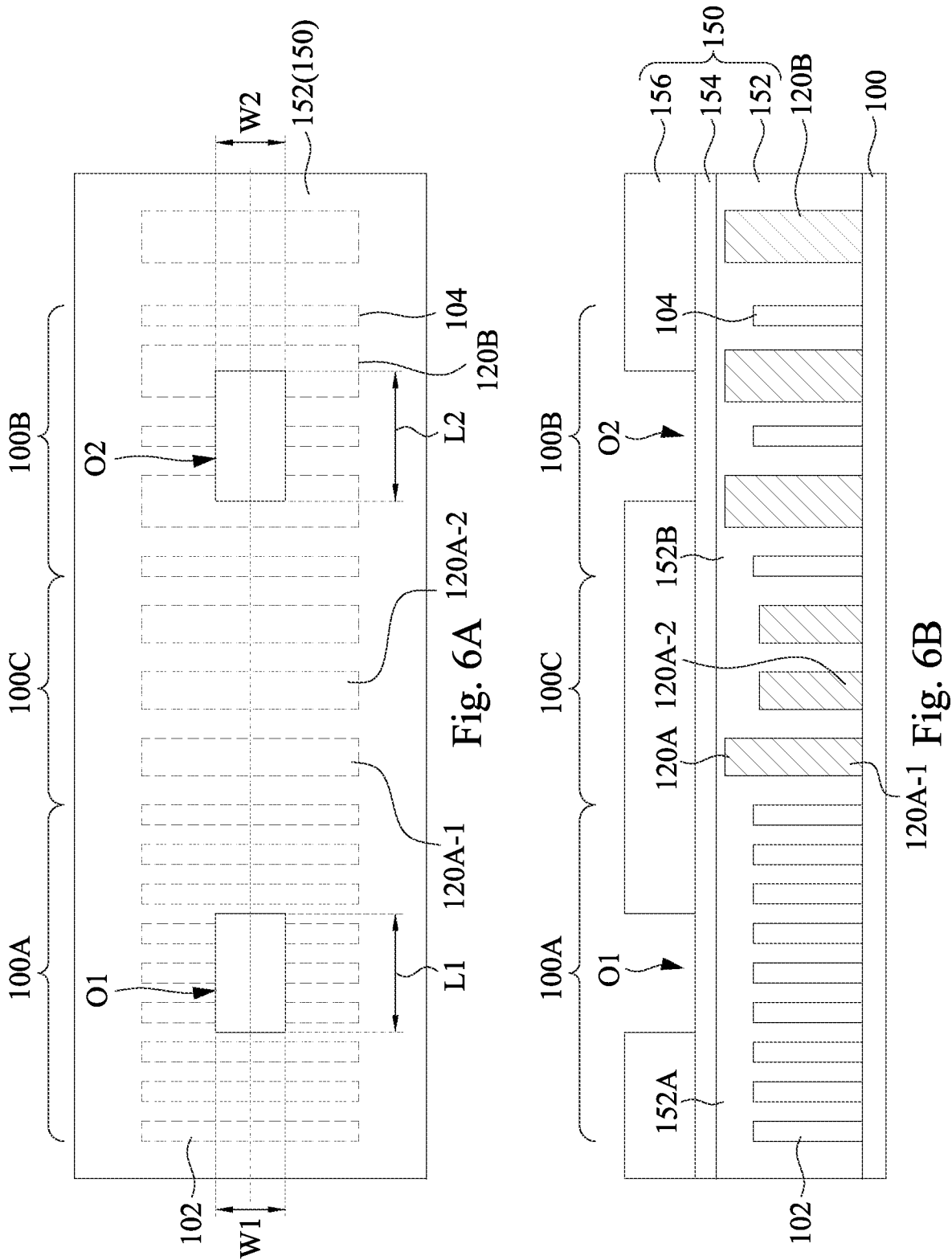

Reference is made to FIGS. 6A and 6B, in which FIG. 6A is a top view of a semiconductor device, and FIG. 6B is a cross-sectional along line B-B of FIG. 6A. A top layer 156 is formed over the middle layer 154, and thus a tri-layer photoresist 150 is formed. In greater details, the tri-layer photoresist 150 includes a bottom layer 152, a middle layer 154 over the bottom layer 152, and a top layer 156 over the middle layer 154. In some embodiments, the tri-layer photoresist 150 can also be referred to as a mask layer.

In some embodiments, the bottom layer 152 contains a material that is patternable and/or has a composition tuned to provide anti-reflection properties. In some embodiments, the bottom layer 152 is a bottom anti-reflective coating (BARC) layer configured to reduce reflection during the photolithography process. In some embodiments, the bottom layer 152 includes monomers or polymers that are not cross-linked, for example a carbon backbone polymer. In other embodiments, the bottom layer 152 is made of nitrogen-free material, such as silicon rich oxide, or silicon oxycarbide (SiOC). In some embodiments, the bottom layer 152 may include spin-on-carbon (SOC). The bottom layer 152 may be formed by a spin coating process. In other embodiments, the bottom layer 152 may be formed by another suitable deposition process.

The middle layer 154 may have a composition that provides an anti-reflective properties and/or hard mask properties for the lithography process. In some embodiments, the middle layer 154 includes a silicon containing layer (e.g., silicon hard mask material). The middle layer 154 may include a silicon-containing inorganic polymer. In other embodiments, the middle layer 154 includes a siloxane polymer (e.g., a polymer having a backbone of O—Si—O—Si— etc.). The silicon ratio of the middle layer 154 may be selected to control the etch rate. In other embodiments, the middle layer 154 may include silicon oxide (e.g., spin-on glass (SOG)), silicon nitride, silicon oxynitride, polycrystalline silicon, a metal-containing organic polymer material that contains metal such as titanium, titanium nitride, aluminum, and/or tantalum; and/or other suitable materials.

The top layer 156 may be a positive photoresist layer or a negative photoresist layer. In some embodiments, the top layer 156 is made of Poly (methyl methacrylate) (PMMA), Poly (methyl glutarimide) (PMGI), Phenol formaldehyde resin (DNQ/Novolac) or SU-8.

The top layer 156 is patterned to form openings O1 and O2. In some embodiments, the opening O1 is formed over the first region 100A of the substrate 100, and the opening O1 may vertically overlap portions of the first semiconductor fins 102. In greater details, in the cross-sectional view of FIG. 6B, the opening O1 overlaps three first semiconductor fins 102, while the disclosure is not limited thereto. On the other hand, the opening O2 is formed over the second region 100B of the substrate 100, and the opening O2 may vertically overlap portions of the second semiconductor fins 104 and the mask strips 120B. In greater details, in the cross-sectional view of FIG. 6B, the opening O2 overlaps one second semiconductor fin 104 and two mask strips 120B on opposite sides of the second semiconductor fin 104.

As shown in the top view of FIG. 6A, the opening O1 may include a length L1 and a width W1, and the opening O2 may include a length L2 and a width W2. In some embodiments, the length L1 is substantially the same as the length L2, and the width W1 is substantially the same as the width W2.

In some embodiments, the top layer 156 is patterned using a mask, exposure to radiation, such as light or an excimer laser, for example, a bake or cure operation to harden the resist, and use of a developer to remove either the exposed or unexposed portions of the resist, depending on whether a positive resist or a negative resist is used, to form the pattern from the mask in the top layer 156. The patterned top layer 156 is then used to etch the underlying middle layer 154 and bottom layer 152.

Figures 7A, 7B:
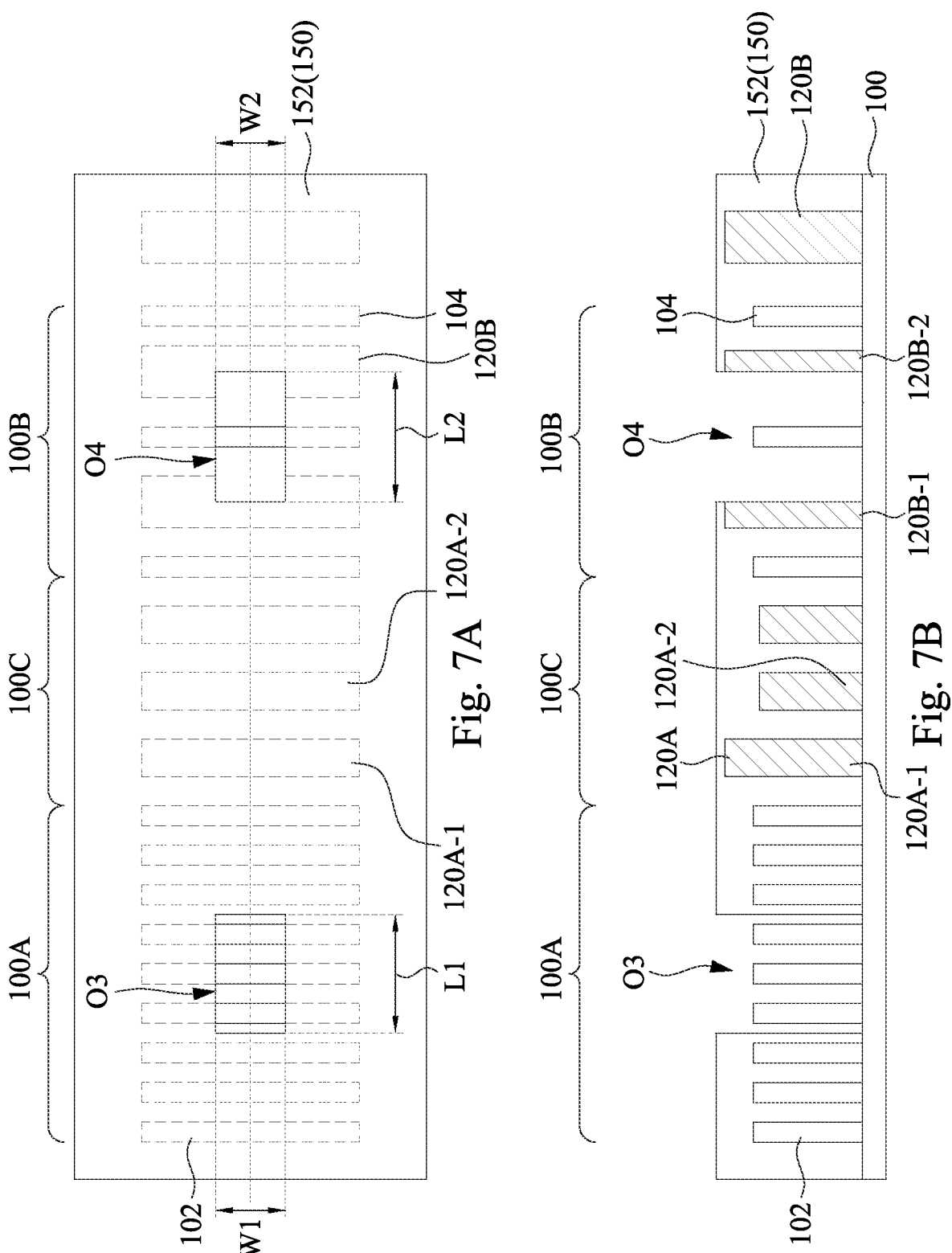

Reference is made to FIGS. 7A and 7B, in which FIG. 7A is a top view of a semiconductor device, and FIG. 7B is a cross-sectional along line B-B of FIG. 7A. The middle layer 154 and the bottom layer 152 are patterned using the patterned top layer 156. In greater details, the middle layer 154 is patterned using the patterned top layer 156 as a mask. As a result, the pattern of the top layer 156 is transferred to the middle layer 154 to form a patterned middle layer 154. After the middle layer 154 is patterned, the bottom layer 152 is patterned using the patterned middle layer 154 as a mask. The middle layer 154 and the bottom layer 152 may be patterned using a plasma process. More specifically, the middle layer 154 is etched through the openings O1 and O2 of the top layer 156 (see FIGS. 6A and 6B) to form openings in the middle layer 154 corresponding to the openings O1 and O2 of the top layer 156, and the bottom layer 152 is then etched through the openings of the middle layer 154 to form the openings O3 and O4 in the bottom layer 152. After the openings O3 and O4 are formed in the bottom layer 152, the top layer 156 and the middle layer 154 may be removed. In some embodiments, openings O3 and O4 of the bottom layer 152 may inherit the patterns of the openings O1 and O2, respectively. After the bottom layer 152 is patterned, portions of the semiconductor fins 102 are exposed by the opening O3, and portions of the second semiconductor fins 104 are exposed by the opening O4.

In some embodiments, during etching the middle layer 154 and the bottom layer 152 through the openings O1 and O2 of the top layer 156 (see FIGS. 6A and 6B), portions of the mask strips 120B vertically overlapped by the opening O2 (or exposed by the opening O4) are removed as well. In greater details, the mask strips 120B may include mask strips 120B-1 and 120B-2 on opposite sides of the second semiconductor fin 104 that is vertically overlapped by the opening O2 (or exposed by the opening O4), and the mask strips 120B-1 and 120B-2 are trimmed during etching the bottom layer 152. In some embodiments, the sidewalls of the trimmed mask strips 120B-1 and 120B-2 may be vertically aligned with sidewalls of the bottom layer 152 after the bottom layer 152 is patterned. In some embodiments, the trimmed mask strips 120B-1 and 120B-2 may be narrower than the mask strips 120A.

As shown in the top view of FIG. 7A, the opening O3 may include a length L3 and a width W3, and the opening O4 may include a length L4 and a width W4. With respect to the openings O1 and O3 (see FIGS. 6A and 7A), the difference between the length L1 of the opening O1 and the length L3 of the opening O3 can be referred to as Bias X1, and the difference between the width W1 of the opening O1 and the width W3 of the opening O3 can be referred to as Bias Y1. With respect to the openings O2 and O4 (see FIGS. 6A and 7A), the difference between the length L2 of the opening O2 and the length L4 of the opening O4 can be referred to as Bias X2, and the difference between the width W2 of the opening O2 and the width W4 of the opening O4 can be referred to as Bias Y2. In some embodiments, the ratio of the Bias X2 to the Bias X1 (e.g., Bias X2/Bias X1) is in a range from about 1 to about 3. In some embodiments, the ratio of the Bias Y2 to the Bias Y1 (e.g., Bias Y2/Bias Y1) is in a range from about 1 to about 3.

Figures 8A, 8B:
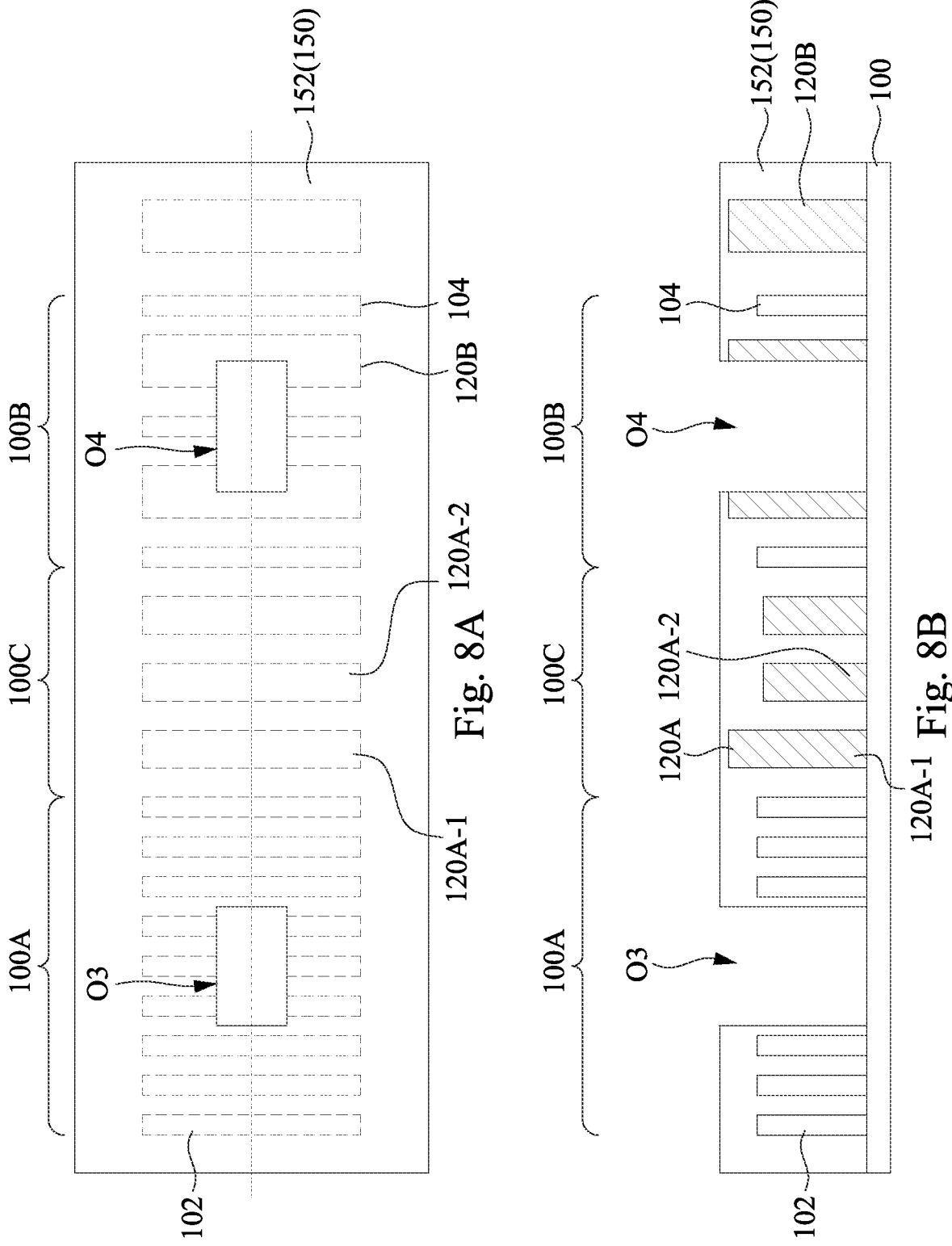

Reference is made to FIGS. 8A and 8B, in which FIG. 8A is a top view of a semiconductor device, and FIG. 8B is a cross-sectional along line B-B of FIG. 8A. Portions of the first semiconductor fins 102 exposed by the opening O3 of the bottom layer 152 and portions of the second semiconductor fins 104 exposed by the opening O4 of the bottom layer 152 are removed (or cut). In some embodiments, the portions of the first semiconductor fins 102 and the second semiconductor fins 104 may be removed by suitable process, such as dry etch, wet etch, or combinations thereof. In some embodiments, during removing the portions of the first semiconductor fins 102 and the second semiconductor fins 104, all of the mask strips 120A are protected by the bottom layer 152, and parts of the mask strips 120B are protected by the bottom layer 152.

Figures 9A, 9B:

Reference is made to FIGS. 9A and 9B, in which FIG. 9A is a top view of a semiconductor device, and FIG. 9B is a cross-sectional along line B-B of FIG. 9A. After the portions of the first semiconductor fins 102 and the second semiconductor fins 104 are removed (or cut), the bottom layer 152 and the mask strips 120A and 120B are removed. Here, the process as described in FIGS. 1A to 9B can be referred to as a fin-cut process, in which unwanted portions of the first semiconductor fins 102 and the second semiconductor fins 104 are removed.

Figure 10:
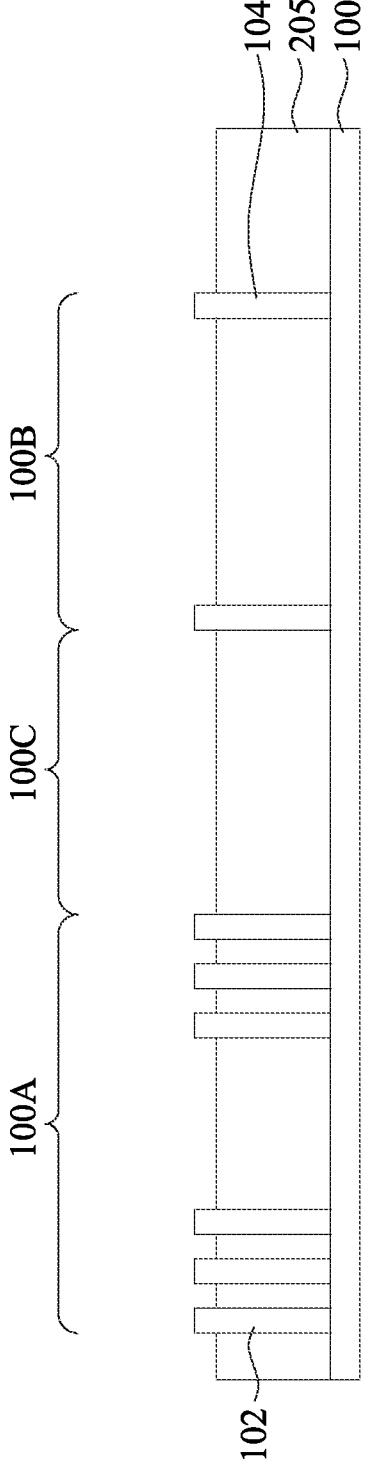

Reference is made to FIG. 10. After the fin-cut process described in FIGS. 1A to 9B is completed, isolation structures 205 are formed over the substrate 100 and laterally surrounding the first semiconductor fins 102 and the second semiconductor fins 104, such that top portions of the first semiconductor fins 102 and the second semiconductor fins 104 protrude over the isolation structures 205. In some embodiments, the isolation structures 205 can also be referred to as shallow trench isolation (STI) structures 205. In some embodiments, the isolation structures 205 may include silicon oxide, which may be formed using, for example, High-Density Plasma (HDP) Chemical Vapor Deposition (CVD). The isolation structures 205 may also include an oxide formed of Flowable Chemical Vapor Deposition (FCVD), spin-on, or the like.

Figures 11A, 11B:
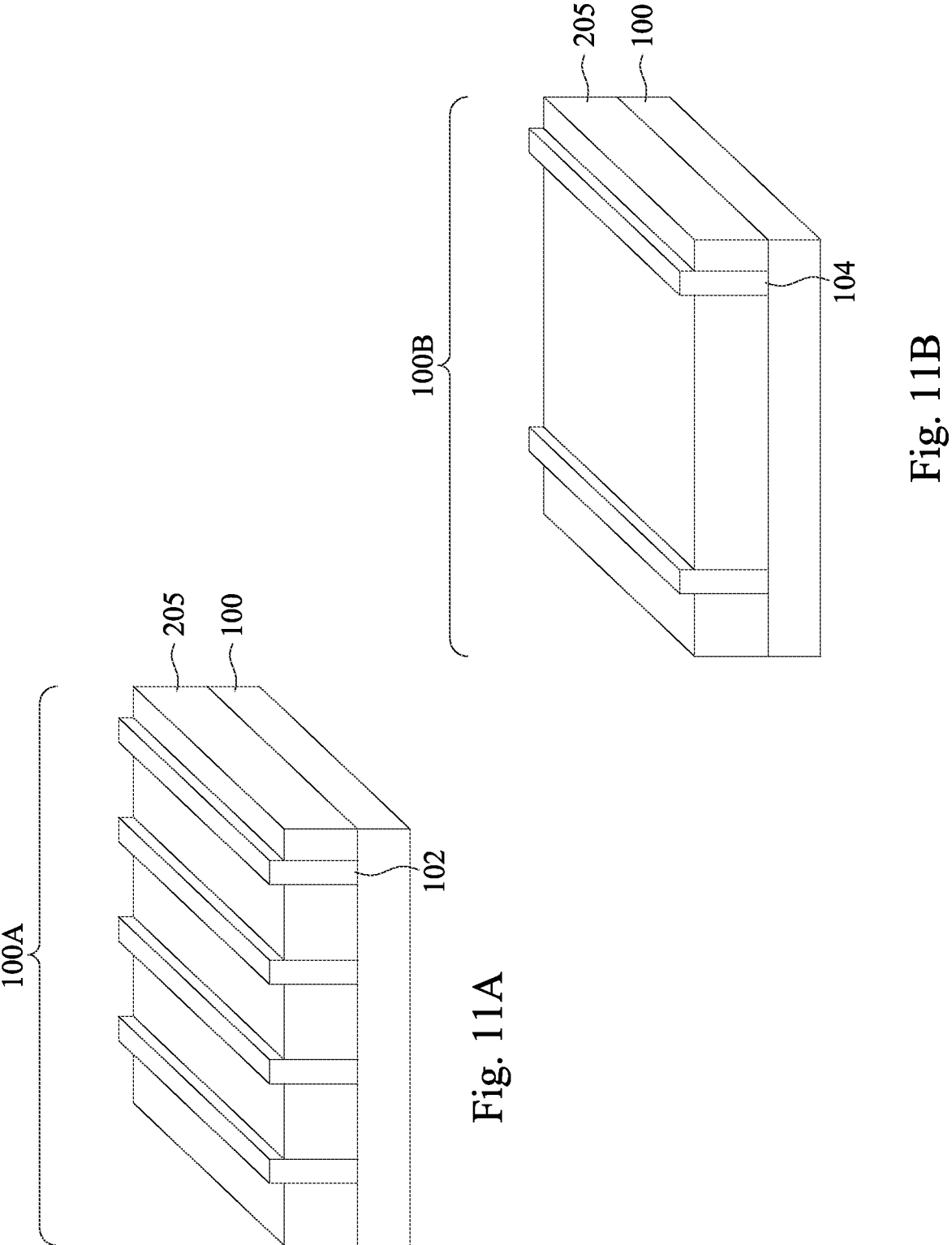

Reference is made to FIGS. 11A and 11B, in which FIGS. 11A and 11B are schematic views of different regions of a substrate. In greater details, FIG. 11A is a schematic view of the first region 100A of the substrate 100 as described in FIGS. 1A to 10, and FIG. 11B is a schematic view of the second region 100B of the substrate 100 as described in FIGS. 1A to 10. For example, first semiconductor fins 102 are disposed over the first region 100A of the substrate 100, and second semiconductor fins 104 are disposed over the second region 100B of the substrate 100, respectively.

Figures 12A, 12B:
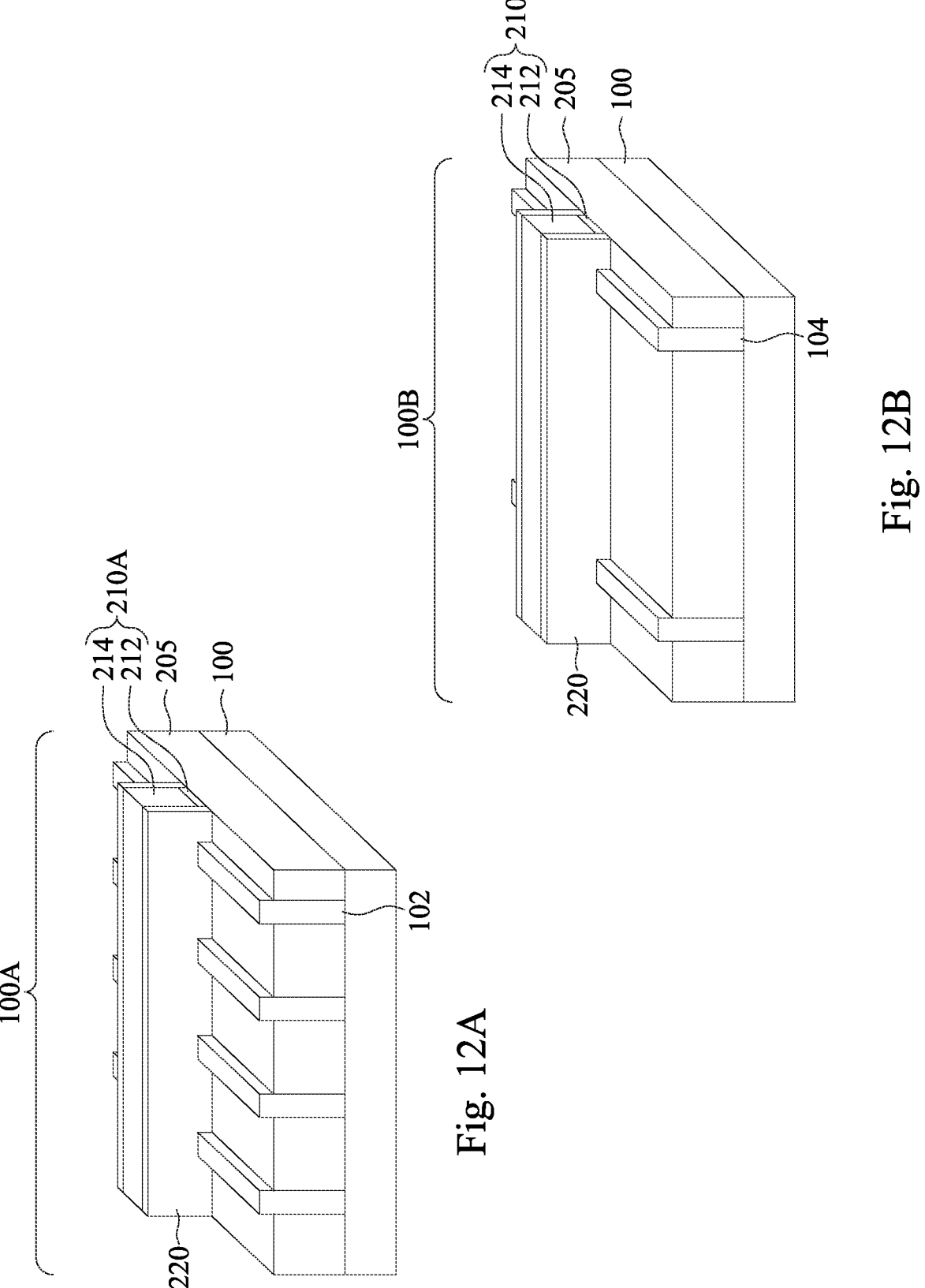

Reference is made to FIGS. 12A and 12B, in which FIGS. 12A and 12B are schematic views of different regions of a substrate. Dummy gate structures 210A and 210B are formed over the first region 100A and the second region 100B of the substrate 100, respectively. In greater details, the dummy gate structures 210A is formed over the first region 100A of the substrate 100 and crossing the first semiconductor fins 102, and the dummy gate structures 210B is formed over the second region 100B of the substrate 100 and crossing the second semiconductor fins 104. In some embodiments, each of the dummy gate structures 210A and 210B includes a gate dielectric 212 and a gate electrode 214 over the gate dielectric 212. The gate electrode 212 may be formed, for example, using polysilicon, although other materials such as metal silicides, metal nitrides, or the like, may also be used. The dummy gate structures 210A and 210B have a lengthwise direction substantially perpendicular to the lengthwise direction of first and second semiconductor fins 102 and 104.

Gate spacers 220 are formed on the sidewalls of dummy gate structures 210A and 210B. In some embodiments, gate spacers 220 may include silicon carbonitride (SiCN), silicon nitride, or the like, and may have a single-layer structure or a multilayer structure.

Figures 13A, 13B:
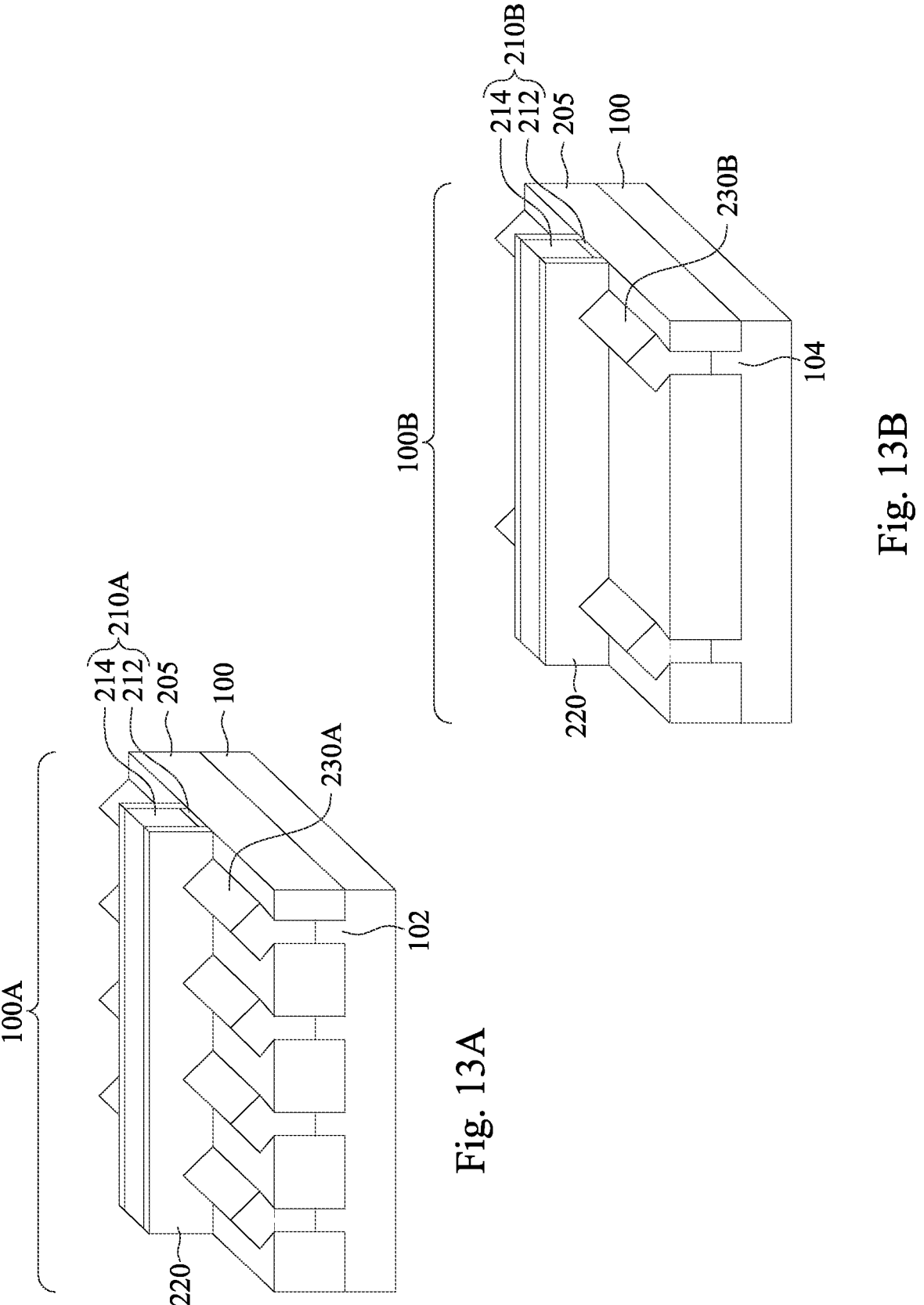

Reference is made to FIGS. 13A and 13B, in which FIGS. 13A and 13B are schematic views of different regions of a substrate. The first and second semiconductor fins 102 and 104 are recessed by using the dummy gate structures 210A and 210B and the gate spacers 220 as etch mask, so as to form recesses in the first and second semiconductor fins 102 and 104, respectively. After the first and second semiconductor fins 102 and 104 are recessed, source/drain epitaxy structures 230A and 230B are formed over the recessed portions of the first and second semiconductor fins 102 and

104, respectively. Source/drain region(s) may refer to a source or a drain, individually or collectively dependent upon the context.

In some embodiments, source/drain epitaxy structures 230A and 230B may include silicon germanium or silicon. In alternative embodiments, source/drain epitaxy structures 230A and 230B may include III-V compound semiconductors such as GaAs, InP, GaN, InGaAs, InAlAs, GaSb, AlSb, AlAs, AlP, GaP, combinations thereof, or multi-layers thereof.

Figures 14A, 14B:
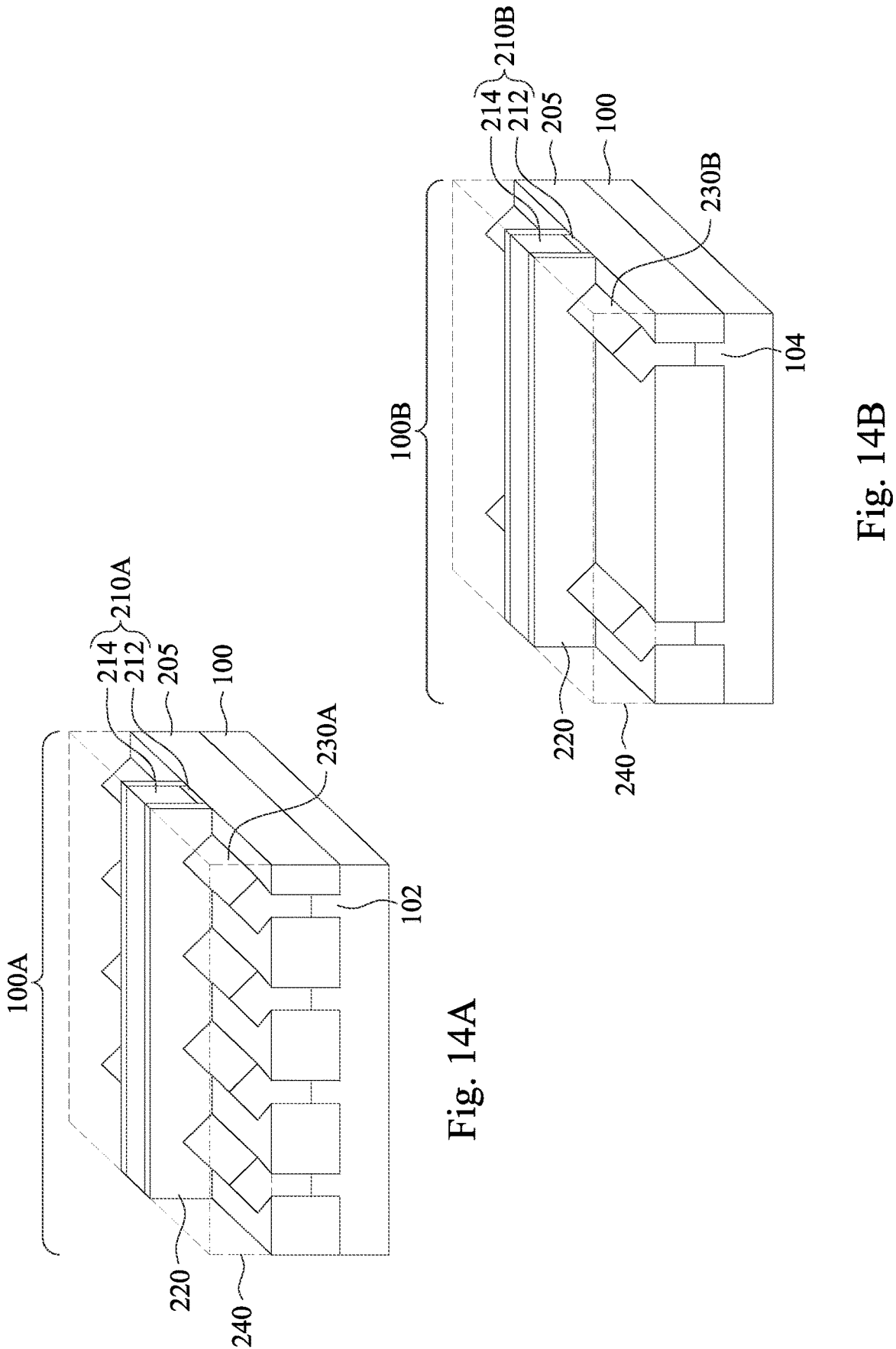

Reference is made to FIGS. 14A and 14B, in which FIGS. 14A and 14B are schematic views of different regions of a substrate. An interlayer dielectric (ILD) layer 240 is deposited over the source/drain epitaxy structures 230A and 230B and laterally surrounding the dummy gate structures 210A and 210B. In some embodiments, a CMP process may be performed to the ILD layer 240 until the top surfaces of the dummy gate structures 210A and 210B are exposed. The ILD layer 240 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) may be formed prior to forming the ILD layer 240. The CESL may include silicon nitride, silicon oxide, silicon oxynitride, or the like.

Figures 15A, 15B:
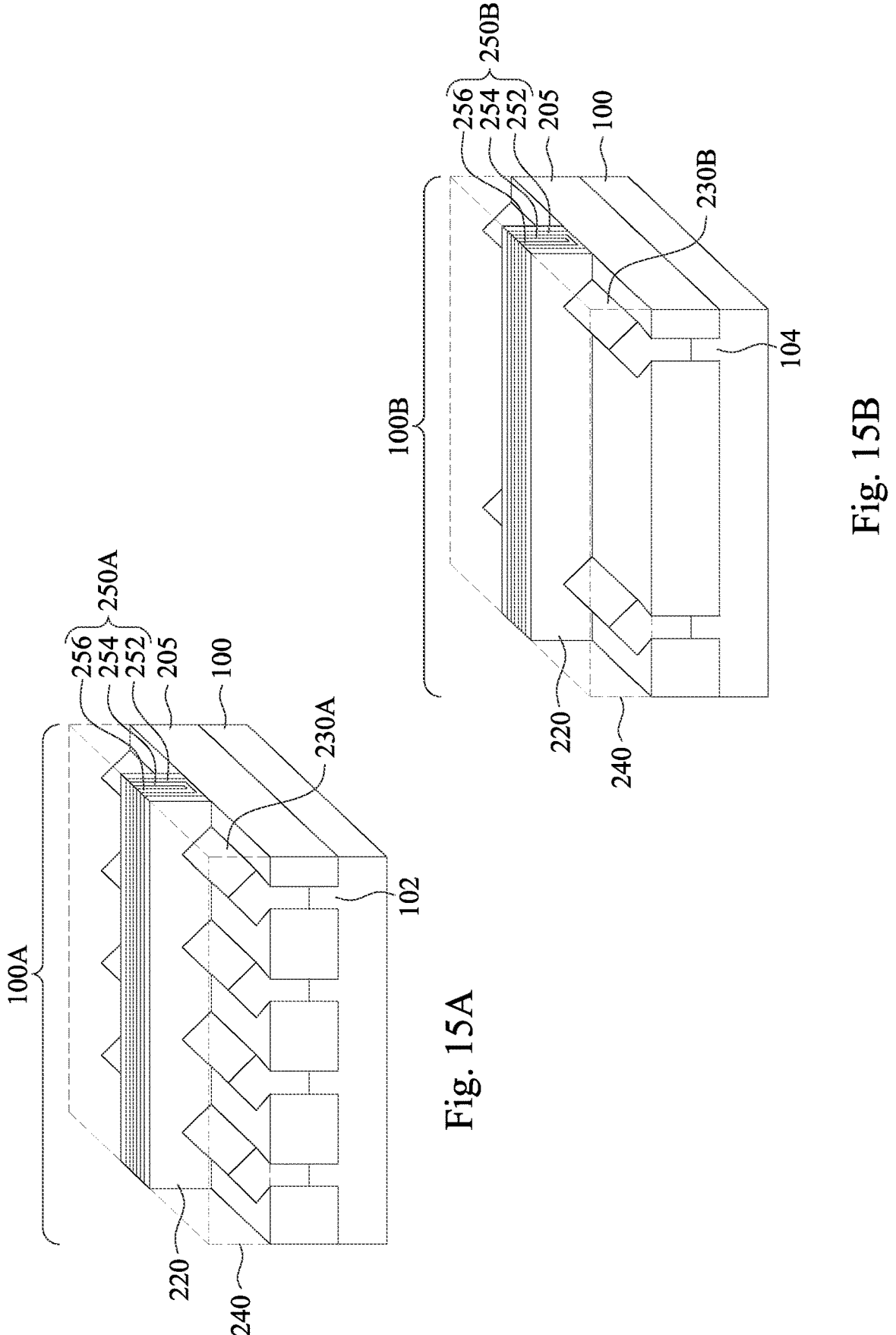

Reference is made to FIGS. 15A and 15B, in which FIGS. 15A and 15B are schematic views of different regions of a substrate. After the ILD layer 240 is formed. The dummy gate structures 210A and 210B are replaced with metal gate structures 250A and 250B, respectively. For example, the dummy gate structures 210A and 210B may be removed to form gate trenches between each pair of the gate spacers 220, then layers of the metal gate structures 250A and 250B may be filled in the gate trenches, and then performing a CMP process to remove excess portions of the metal gate structures 250A and 250B until the ILD layer 240 is exposed.

In some embodiments, each of the metal gate structures 250A and 250B include a include a gate dielectric layer 252, a work function metal layer 254 over the gate dielectric layer 252, and a gate electrode 256 over the work function metal layer 254. In some embodiments, the gate dielectric layer 252 may include one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer 252 may be formed by CVD, ALD or any suitable method.

In some embodiments, the work function metal layer 254 may be made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function metal layer 144, and for the p-channel FET, one or more of TiAlC, Al, TiAl, TaN, TaAlC, TiN, TiC and Co is used as the work function metal layer 254. The work function metal layer 254 may be formed by ALD, PVD, CVD, e-beam evaporation, or other suitable process.

In some embodiments, the gate electrode 256 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode 256 may be formed by CVD, ALD, electro-plating, or other suitable method.

After the metal gate structures 250A and 250B are formed, first and second transistors are formed over the substrate. In some embodiments, the first transistors are formed over the first group of the first semiconductor fins 102, in which each first transistor may include a metal gate structure 250A, source/drain epitaxy structures 230A on opposite sides of the metal gate structure 250A, and channel region of a respective first semiconductor fin 102 that is covered by the metal gate structure 250A. Similarly, the second transistors are formed over the second group of the second semiconductor fins 104, in which each second transistor may include a metal gate structure 250B, source/drain epitaxy structures 230B on opposite sides of the metal gate structure 250B, and channel region of a respective second semiconductor fin 104 that is covered by the metal gate structure 250B.

FIGS. 16A to 23 illustrate a method in various stages of forming a semiconductor device in accordance with some embodiments of the present disclosure. It is noted that some elements described in FIGS. 16A to 23 are the same as or similar to the elements described in FIGS. 1A to 15B, such elements are labeled the same and relevant details will not be repeated for brevity.

Figure 16A:
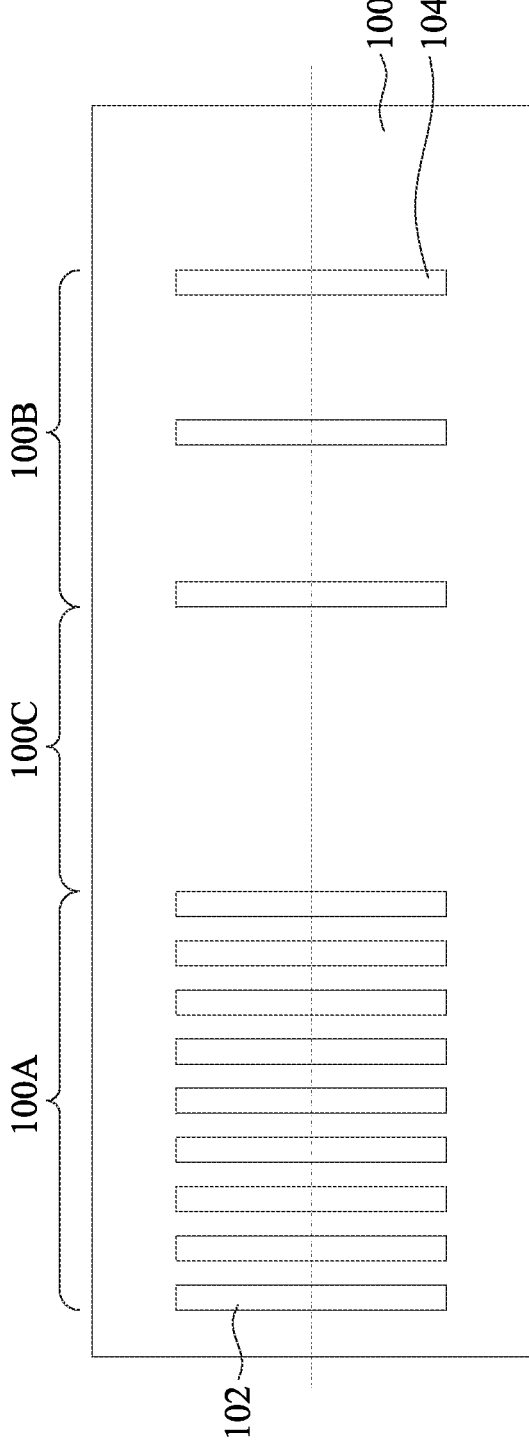
FIGS. 16A to 23 illustrate a method in various stages of forming a semiconductor device in accordance with some embodiments of the present disclosure.
Figure 16B:
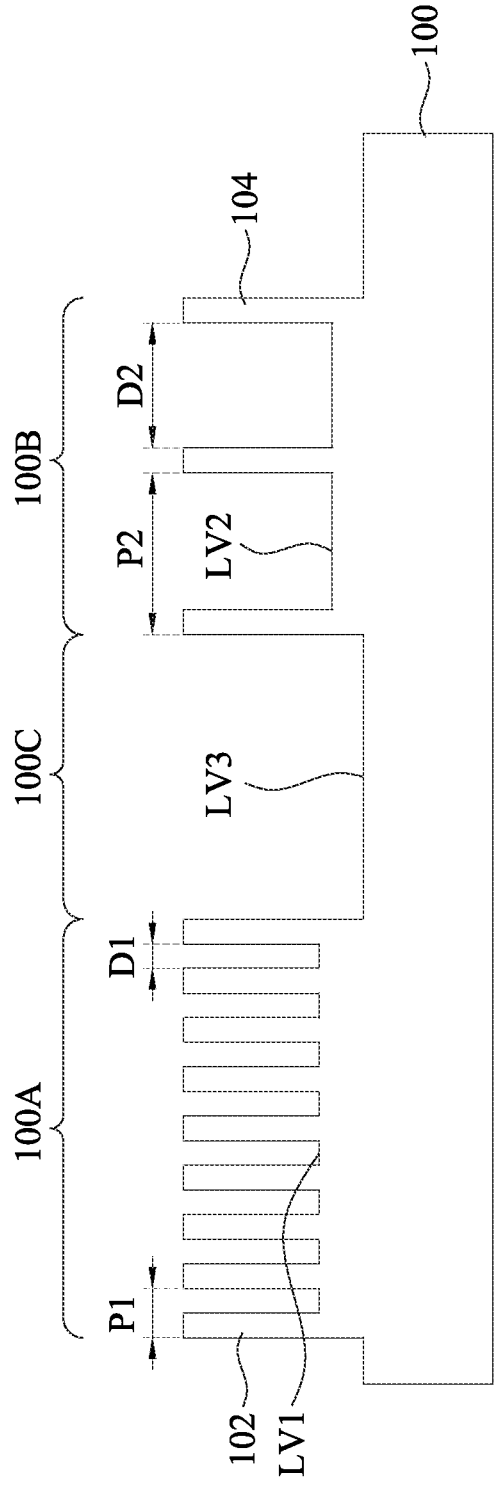

Reference is made to FIGS. 16A and 16B. FIGS. 16A and 16B are similar to FIGS. 1A and 1B. The difference between FIGS. 16A/16B and FIGS. 1A/1B is that during forming the first semiconductor fins 102 and the second semiconductor fins 104, because of the density difference in different regions of the substrate 100, the etching process for forming the first semiconductor fins 102 and the second semiconductor fins 104 may cause the top surfaces of the substrate 100 having different levels at different regions of the substrate 100. For example, as shown in FIG. 16B, because the first region 100A of the substrate 100 has higher fin density, the etching rate may be lowered, and thus the top surface of the substrate 100 within the first region 100A is at a level LV1. On the other hand, because the second region 100B of the substrate 100 has less fin density, the etching rate may be increased, and thus the top surface of the substrate 100 within the second region 100B is at a level LV2 that is lower than the level LV1. Moreover, because the third region 100 is free of semiconductor fin, the etching process may have highest etching rate at this region, and thus the top surface of the substrate 100 within the third region 100C is at a level LV3 that is lower than the levels LV1 and LV2. Stated another way, the top surface of the substrate 100 within the first region 100A is higher than the top surface of the substrate 100 within the second region 100B, and the top surface of the substrate 100 within the second region 100B is higher than the top surface of the substrate 100 within the third region 100C.

Figure 17A:
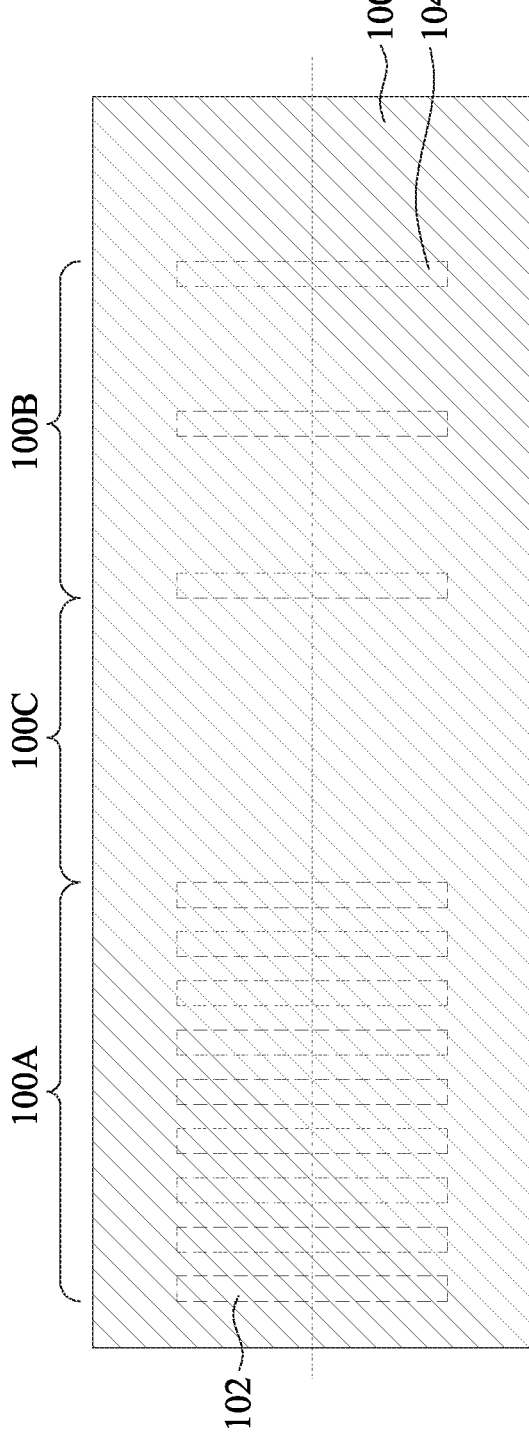
Figure 17B:
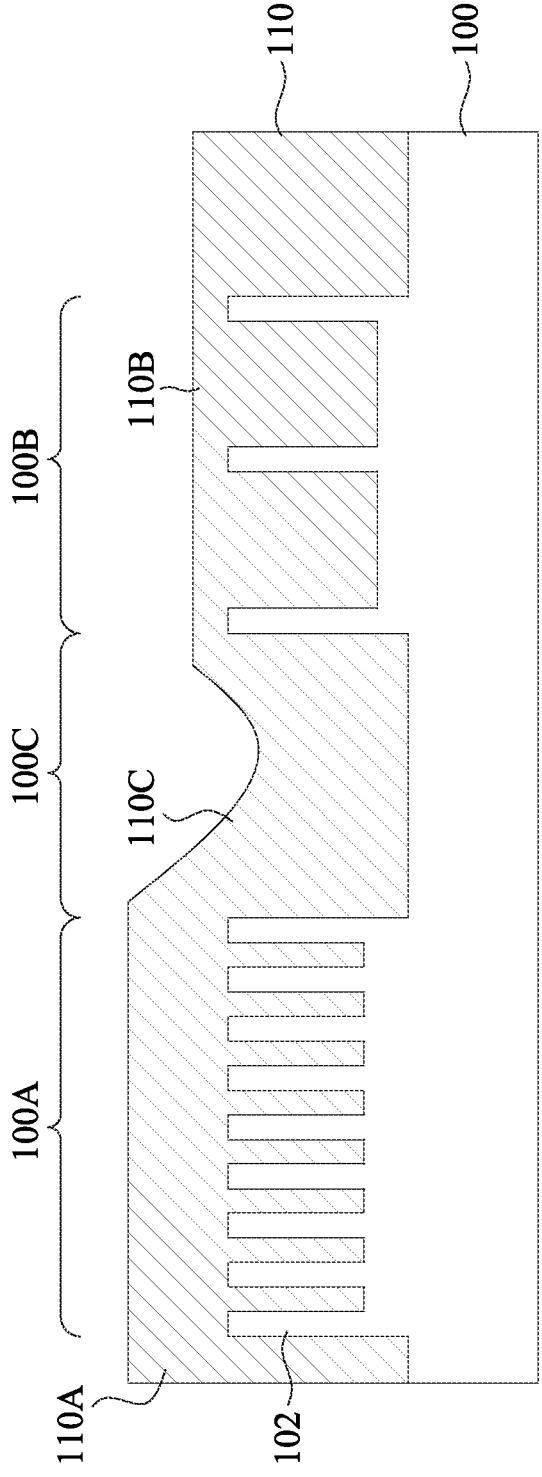

Reference is made to FIGS. 17A and 17B. FIGS. 17A and 17B are similar to FIGS. 2A and 2B. A mask layer 110 is formed over the substrate 100 and covering the first semiconductor fins 102 and the second semiconductor fins 104. It is noted that the top surface profile of the mask layer 110 is similar to those described with respect to FIGS. 2A and 2B. However, with respect to the bottom surface of the mask layer 110, the bottom surface of the mask layer 110 within the first region 100A is higher than the bottom surface of the mask layer 110 within the second region 100B, and the bottom surface of the mask layer 110 within the second region 100B is higher than the bottom surface of the mask layer 110 within the third region 100C.

Figure 18A:
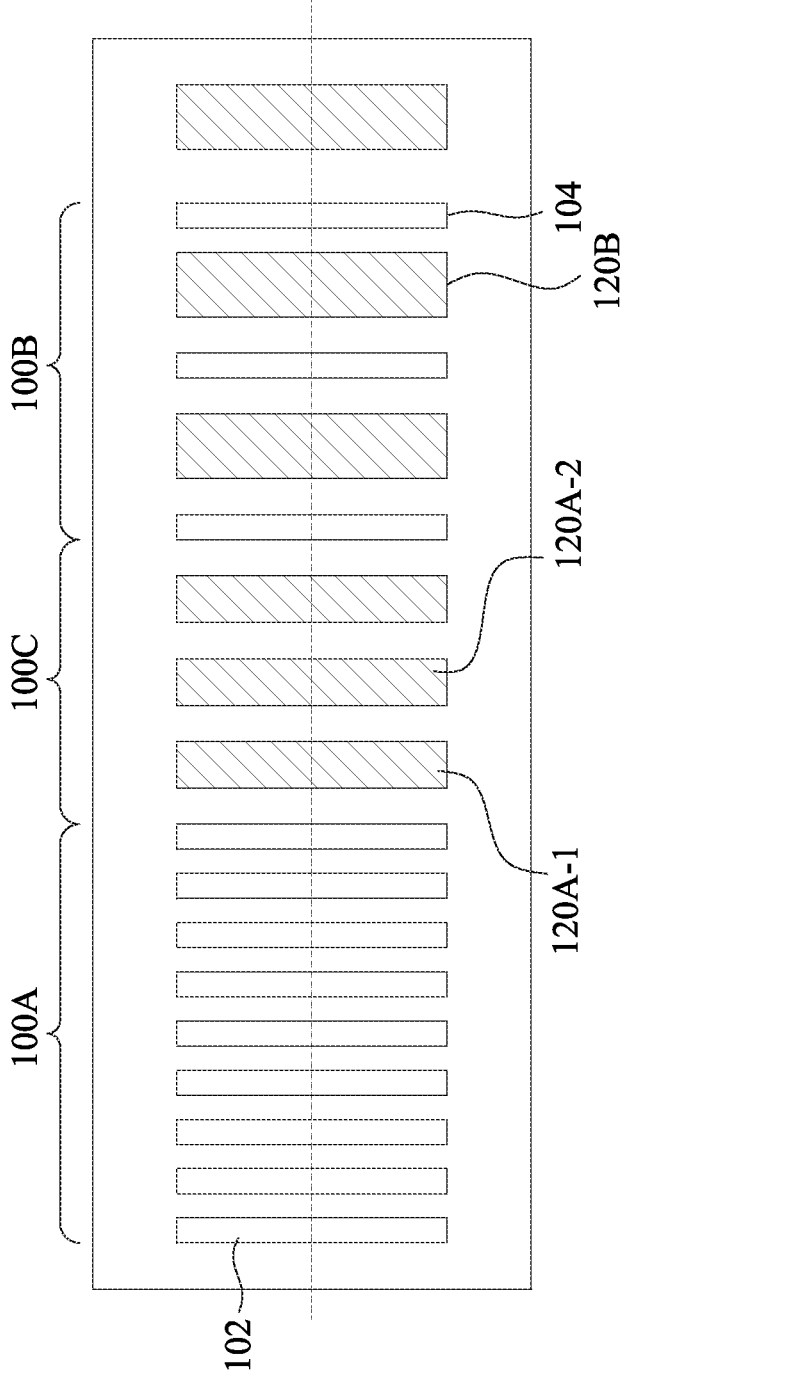
Figure 18B:
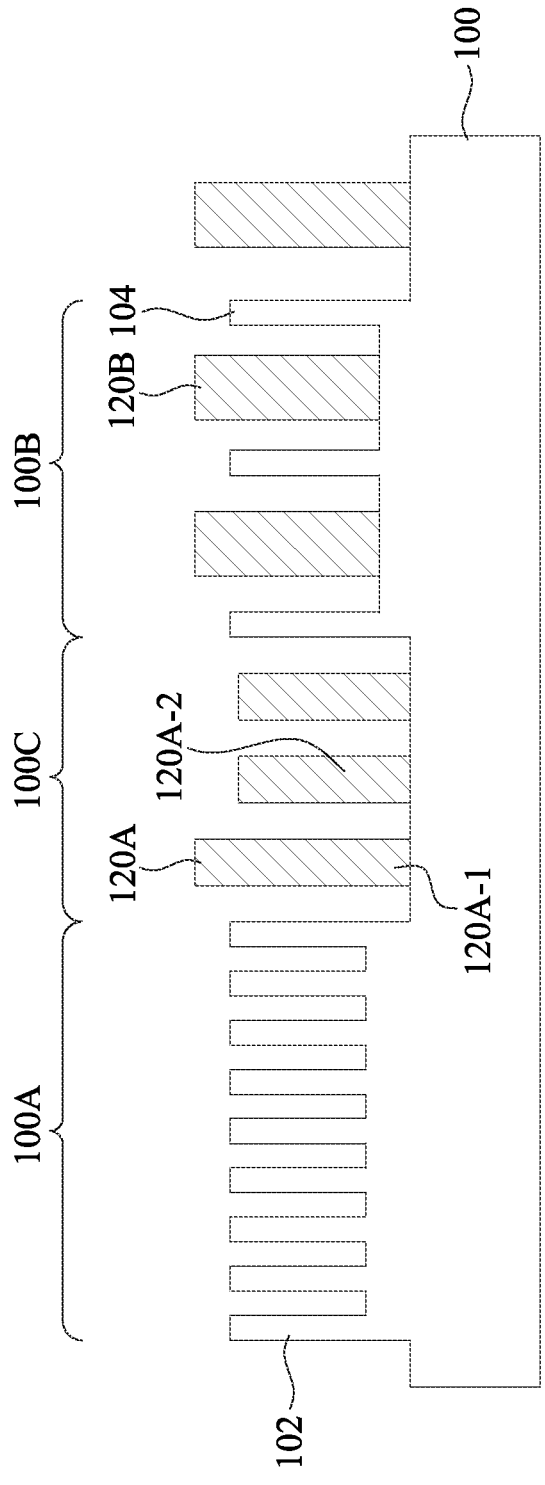

Reference is made to FIGS. 18A and 18B. FIGS. 18A and 18B are similar to FIGS. 3A and 3B. The mask layer 110 (see FIGS. 2A and 2B) is patterned to form a group of mask strips 120A and a group of mask strips 120B. In some embodiments, the group of mask strips 120A is within the third region 100C of the substrate 100. That is, the mask strips 120A is between the group of the first semiconductor fins 102 and the group of the second semiconductor fins 104. On the other hand, the group of mask strips 120B is within second region 100B of the substrate 100.

Similar to those described with respect to FIGS. 3A and 3B, the mask strips 120A may include a mask strip 120A-1 that is closest to the group of the first semiconductor fins 102, and may include mask strips 120A-2 other than the mask strip 120A-1, in which the top surface of the mask strip 120A-1 is higher than the top surfaces of other mask strips 120A-2. In some embodiments, because the substrate 100 has the lowest top surface within the third region 100, the bottom surfaces of the mask strips 120A are lower than the bottom surfaces of the mask strips 120B that is within the second region 100B of the substrate 100. Moreover, the bottom surfaces of the mask strips 120A and 120B are both lower than the top surface of the substrate 100 within first region 100A.

Figure 19A:
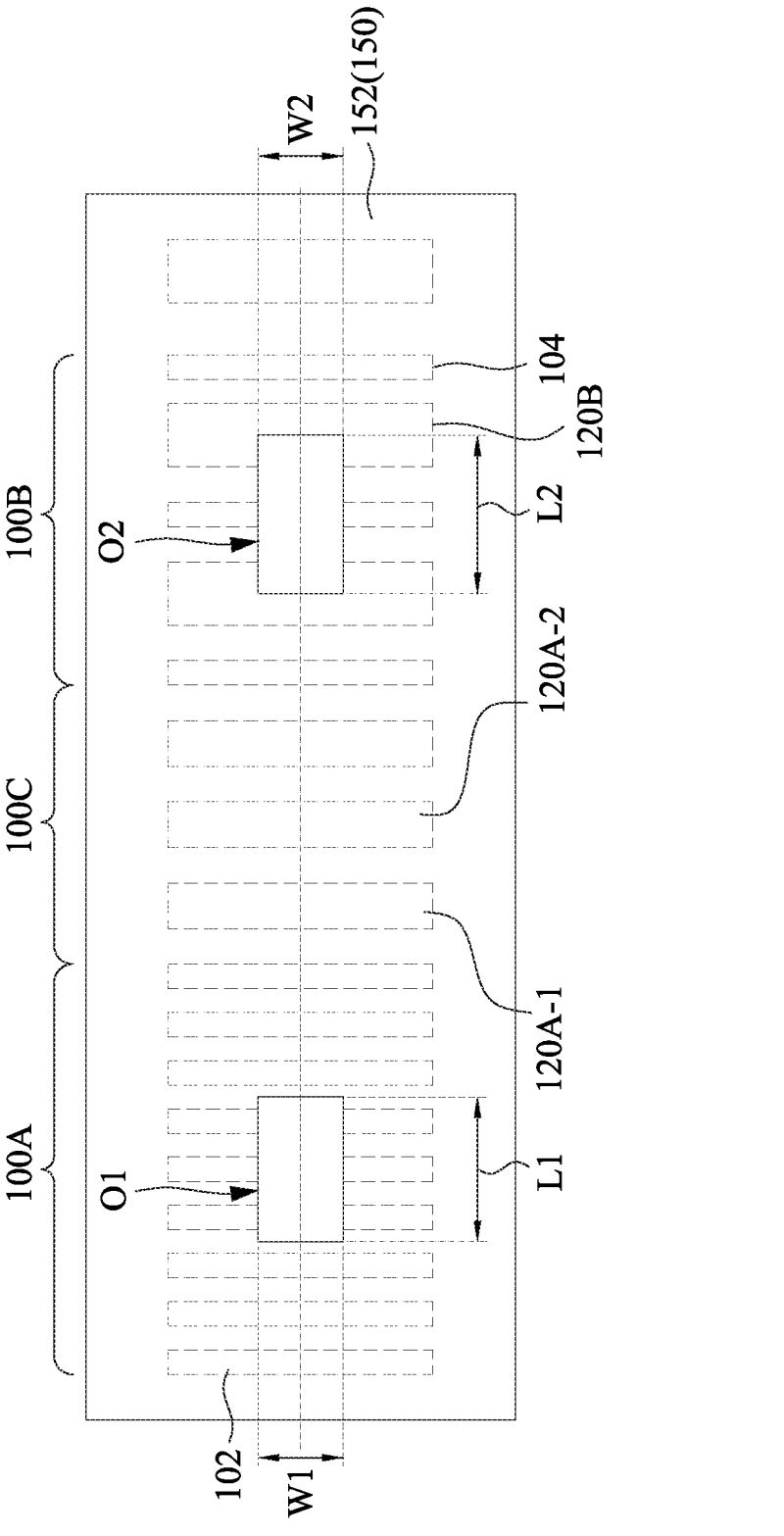
Figure 19B:
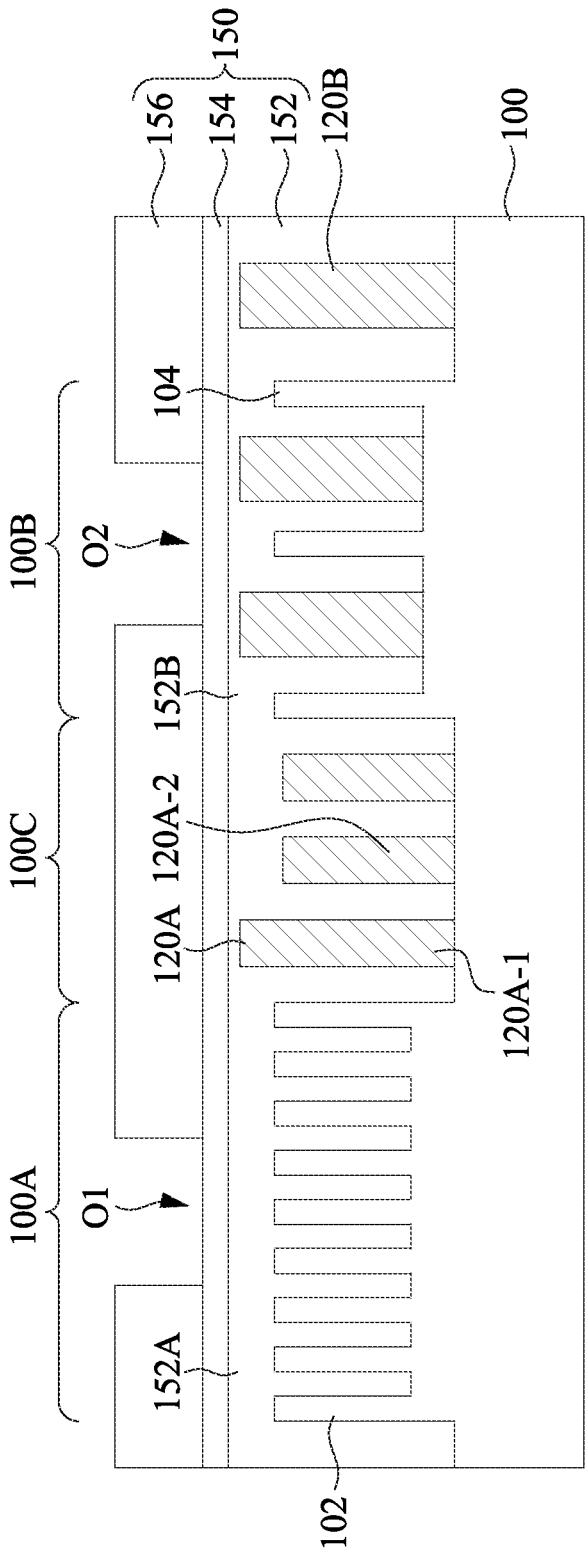

Reference is made to FIGS. 19A and 19B. The structure shown in FIGS. 18A and 18B may undergo the processes described in FIGS. 4A to 6B, and the resulting structure is shown in FIGS. 19A and 19B. In greater details, a tri-layer photoresist 150 including a bottom layer 152, a middle layer 154, and a top layer 156 is formed. In some embodiments, the bottom surface of the bottom layer 152 within the first region 100A is higher than the bottom surface of the bottom layer 152 within the second region 100B, and the bottom surface of the bottom layer 152 within the second region 100B is higher than the bottom surface of the bottom layer 152 within the third region 100C.

Figure 20A:
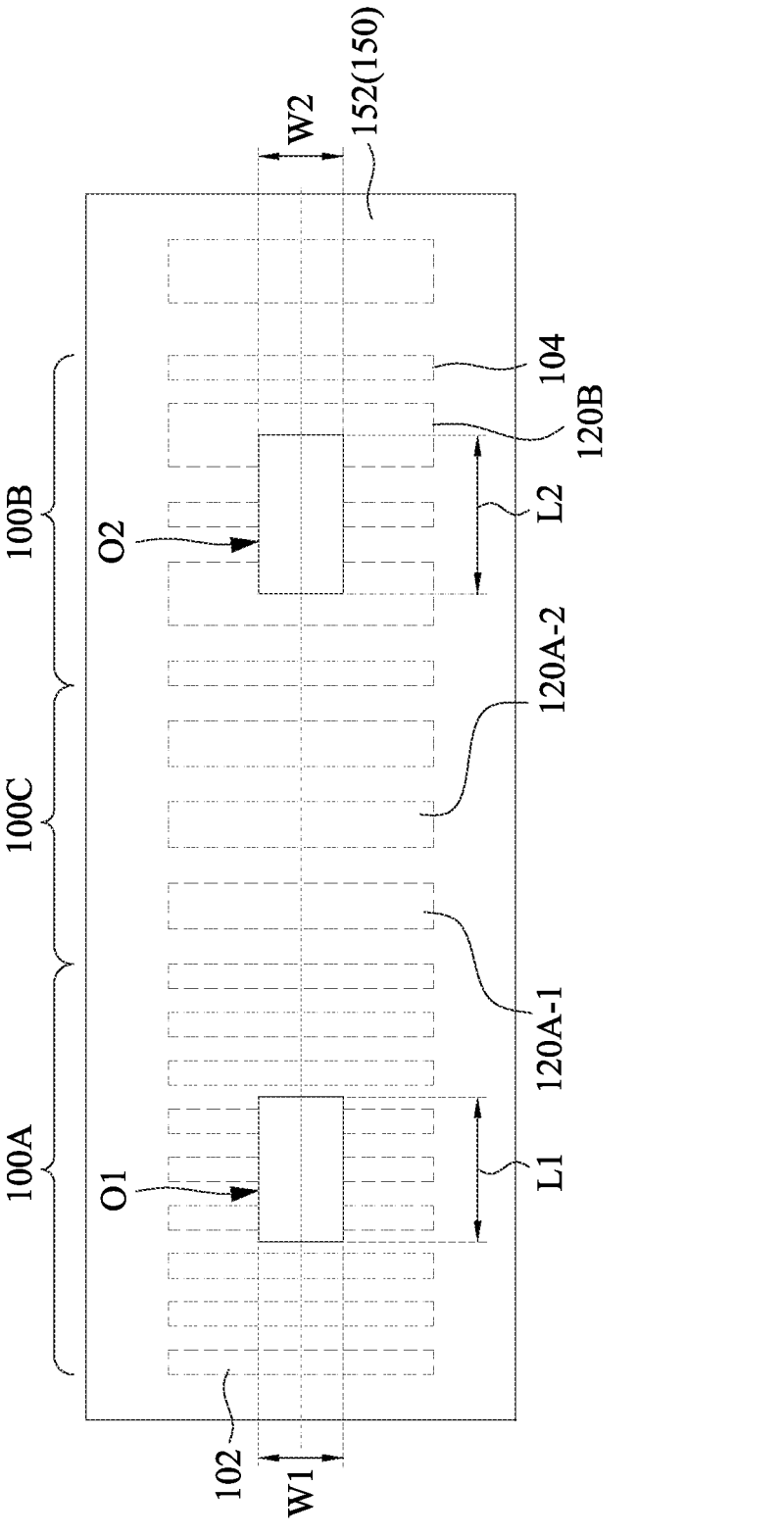
Figure 20B:
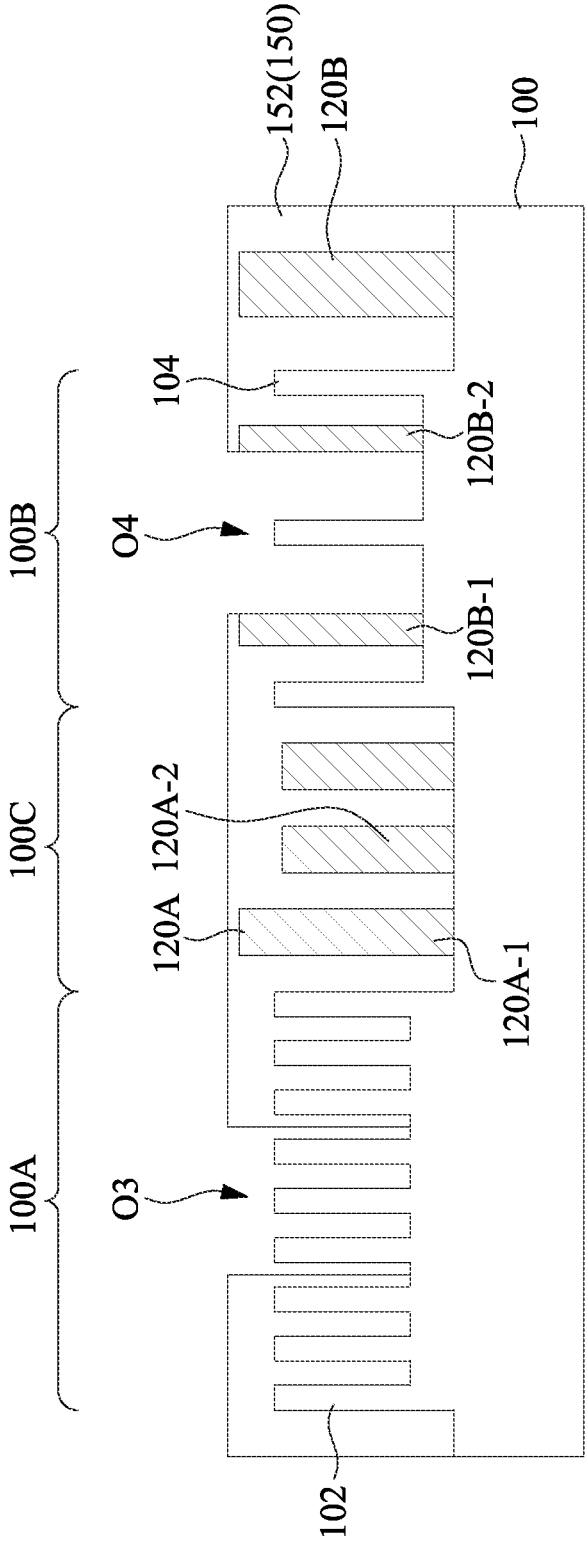

Reference is made to FIGS. 20A and 20B. FIGS. 20A and 20B are similar to FIGS. 7A and 7B. The middle layer 154 and the bottom layer 152 are patterned using the patterned top layer 156. In greater details, the middle layer 154 is patterned using the patterned top layer 156 as a mask. As a result, the pattern of the top layer 156 is transferred to the middle layer 154 to form a patterned middle layer 154. After the middle layer 154 is patterned, the bottom layer 152 is patterned using the patterned middle layer 154 as a mask. The middle layer 154 and the bottom layer 152 may be patterned using a plasma process. More specifically, the middle layer 154 is etched through the openings O1 and O2 of the top layer 156 (see FIGS. 6A and 6B) to form openings in the middle layer 154 corresponding to the openings O1 and O2 of the top layer 156, and the bottom layer 152 is then etched through the openings of the middle layer 154 to form the openings O3 and O4 in the bottom layer 152. After the openings O3 and O4 are formed in the bottom layer 152, the top layer 156 and the middle layer 154 may be removed. In some embodiments, openings O3 and O4 of the bottom layer 152 may inherit the patterns of the openings O1 and O2, respectively. After the bottom layer 152 is patterned, portions of the semiconductor fins 102 are exposed by the opening O3, and portions of the second semiconductor fins 104 are exposed by the opening O4.

Figure 21A:
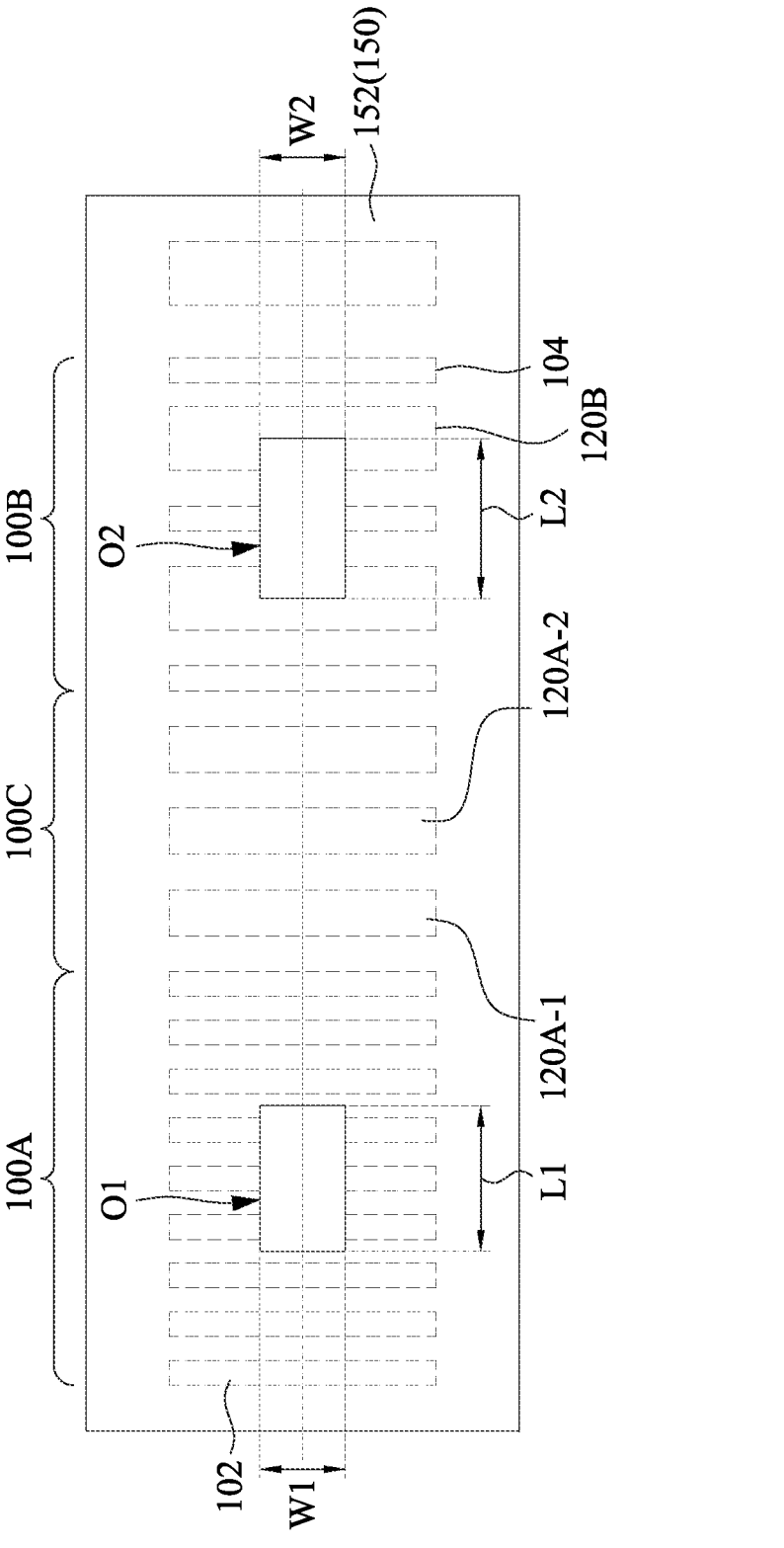
Figure 21B:
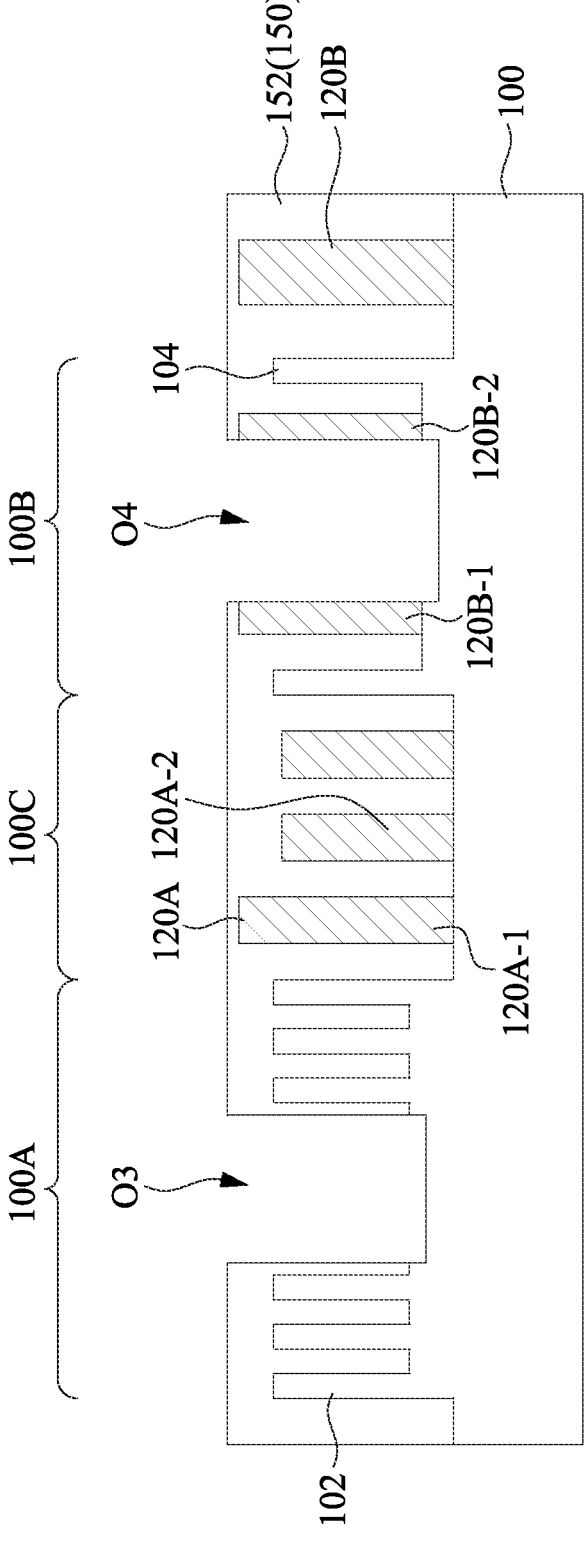

Reference is made to FIGS. 21A and 21B. FIGS. 21A and 21B are similar to FIGS. 8A and 8B. Portions of the first semiconductor fins 102 exposed by the opening O3 of the bottom layer 152 and portions of the second semiconductor fins 104 exposed by the opening O4 of the bottom layer 152 are removed (or cut). In some embodiments, during the removal of the exposed first semiconductor fins 102 and the exposed second semiconductor fins 104, portions of the substrate 100 exposed by the openings O3 and O4 may also be etched, such that top surfaces of such portions may also be lowered. This is because the substrate 100 may be formed of a same material as the first semiconductor fins 102 and the second semiconductor fins 104, and thus the substrate 100 may not include sufficient etching selectivity to the first semiconductor fins 102 and the second semiconductor fins 104.

Figure 22A:
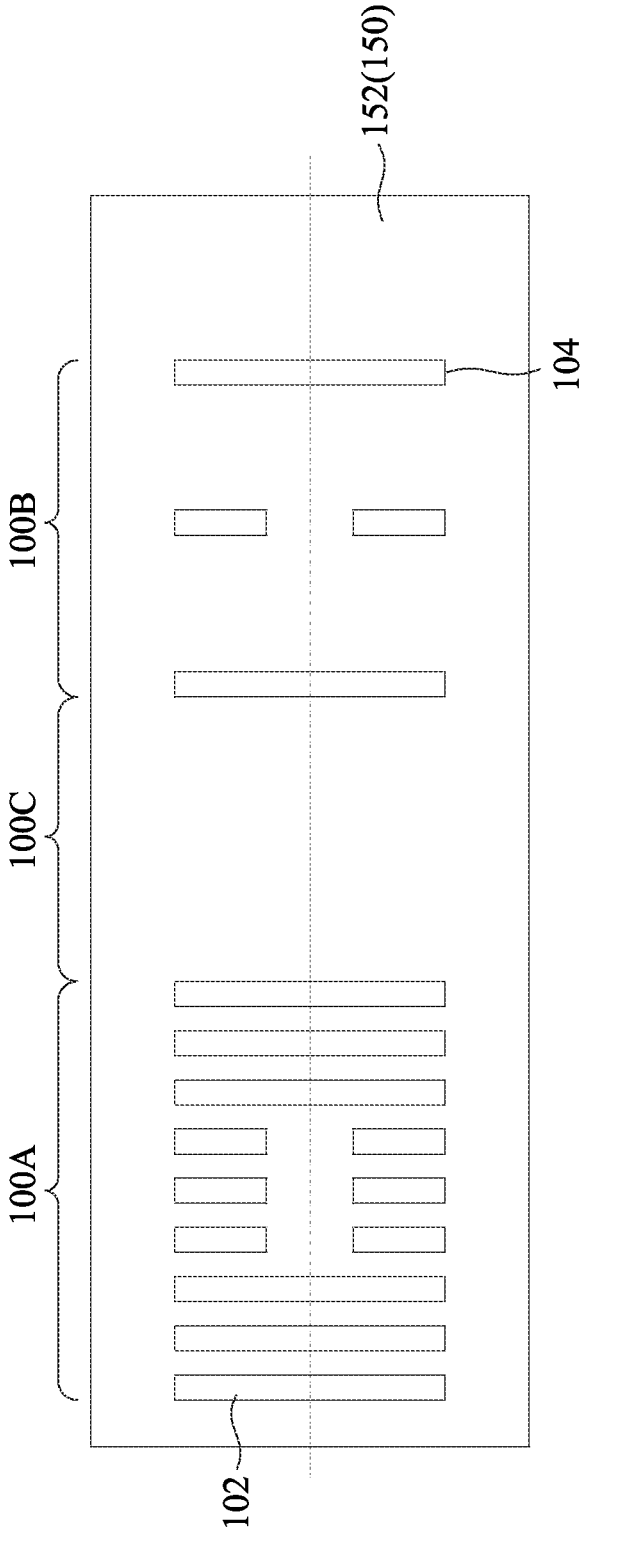
Figure 22B:
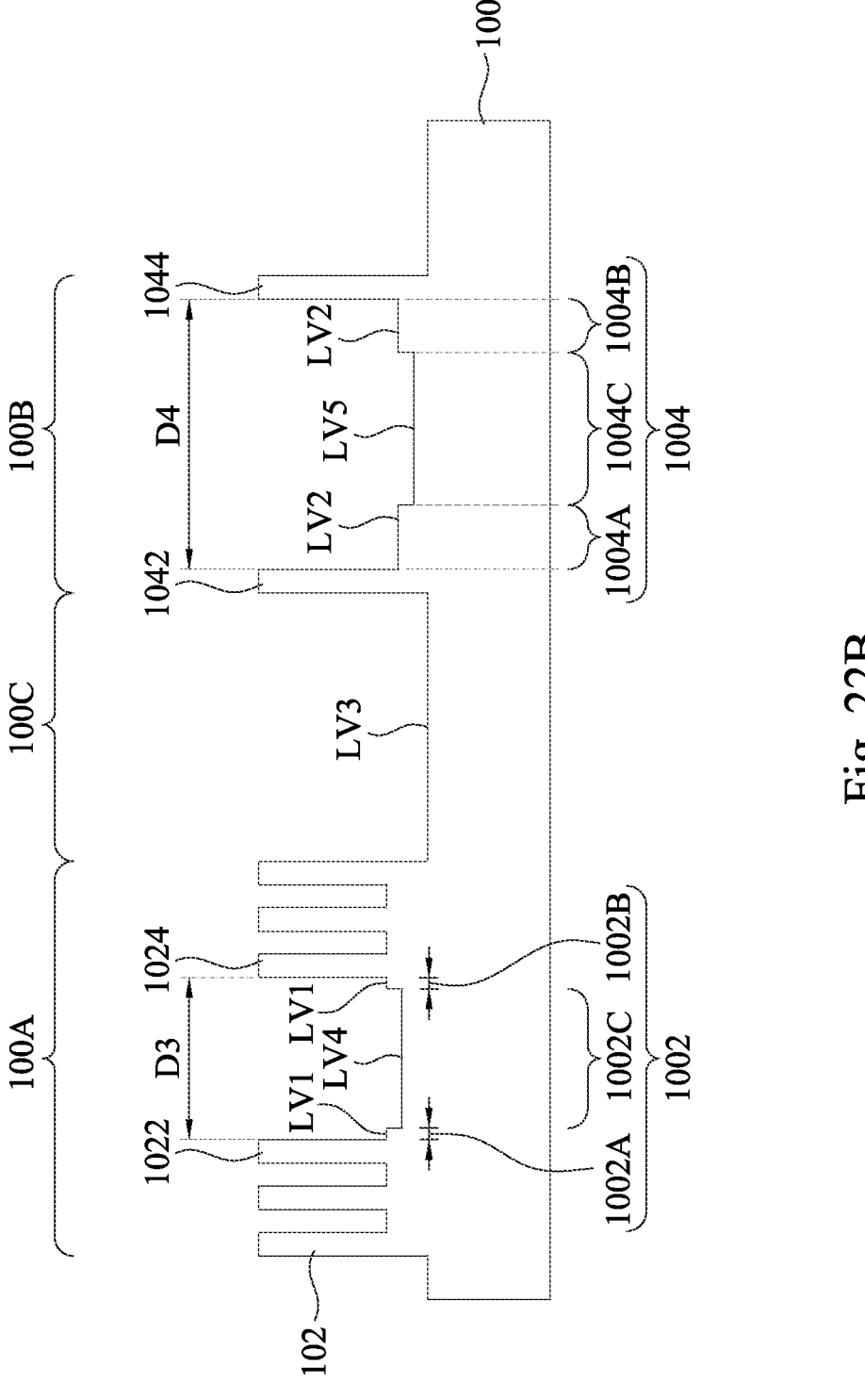

Reference is made to FIGS. 22A and 22B. FIGS. 22A and 22B are similar to FIGS. 9A and 9B. After the portions of the first semiconductor fins 102 and the second semiconductor fins 104 are removed (or cut), the bottom layer 152 and the mask strips 120A and 120B are removed.

In the cross-sectional view of FIG. 22B, after the fin-cut process, the substrate 100 may include a portion 1002 within the first region 100A, in which the portion 1002 of the substrate 100 is between the first semiconductor fins 1022 and 1024 of the first group of the first semiconductor fins 102. In greater details, because some of the first semiconductor fins 102 between the first semiconductor fins 1022 and 1024 have been removed, the distance D3 between the first semiconductor fins 1022 and 1024 is greater than the distance D1 between the closest two of the first semiconductor fins 102 of the first group of the first semiconductor fins 102 (see FIG. 16B). In some embodiments, the distance D3 between the first semiconductor fins 1022 and 1024 can also be referred to as the lateral width of the portion 1002 of the substrate 100. In some embodiments, the portion 1002 of the substrate 100 has stepped top surface profile. For example, the portion 1002 of the substrate 100 includes first and second segments 1002A and 1002B, and a third segment 1002C between the first and second segments 1002A and 1002B. The top surfaces of the first and second segments 1002A and 1002B are at the level LV1, while the top surface of the third segment 1002C is at the level LV4 lower than the level LV1. In some embodiments, the lower top surface of the third segment 1002C is resulted from the fin-cut process as described in FIGS. 21A and 21B.

In some embodiments, the portion 1002 of the substrate 100 can be regarded as having a stepped top surface profile, in which the stepped top surface profile includes a lower step (e.g., level LV4), two upper steps (e.g., level LV1), and two step rises extending from opposite sides of the lower step to the upper steps.

Similarly, after the fin-cut process, the substrate 100 may include a portion 1004 within the second region 100B, in which the portion 1004 of the substrate 100 is between the second semiconductor fins 1042 and 1044 of the second group of the second semiconductor fins 104. In greater details, because at least one of the second semiconductor fin 104 between the second semiconductor fins 1042 and 1044 have been removed, the distance D4 between the second semiconductor fins 1042 and 1044 is greater than the distance D2 between the closest two of the second semiconductor fins 102 of the second group of the second semiconductor fins 102 (see FIG. 16B). In some embodiments, the distance D3 between the second semiconductor fins 1042 and 1044 can also be referred to as the lateral width of the portion 1004 of the substrate 100. In some embodiments, the portion 1004 of the substrate 100 has stepped top surface profile. For example, the portion 1004 of the substrate 100 includes first and second segments 1004A and 1004B, and a third segment 1004C between the first and second segments 1004A and 1004B. The top surfaces of the first and second segments 1004A and 1004B are at the level LV2, while the top surface of the third segment 1004C is at the level LV5 lower than the level LV2. In some embodiments, the lower top surface of the third segment 1004C is resulted from the fin-cut process as described in FIGS. 21A and 21B.

In some embodiments, the level LV1 may be higher than the level LV2. The level LV4 may be higher than the level LV5. In some embodiments, the levels LV1, LV2, LV4, and LV5 may be higher than the level LV3.

In some embodiments, the portion 1004 of the substrate 100 can be regarded as having a stepped top surface profile, in which the stepped top surface profile includes a lower step (e.g., level LV5), two upper steps (e.g., level LV2), and two step rises extending from opposite sides of the lower step to the upper steps.

In some embodiments, the portion 1004 of the substrate 100 is wider than the portion 1002 of the substrate 100. That is, the stepped top surface profile of the portion 1004 is wider than the stepped top surface profile of the portion 1002. In some embodiments, the segments 1004A and 1004B of the portion 1004 of the substrate 100 are wider than the segments 1002A and 1002B of the portion 1002 of the substrate 100. That is, the upper steps of the stepped top surface profile of the portion 1004 are wider than the upper steps of the stepped top surface profile of the portion 1002. Stated another way, the upper steps of the stepped top surface profile of the portion 1004 have longer step runs than the upper steps of the stepped top surface profile of the portion 1002.

In some embodiments, the width of the portion 1002C is wider than the fin pitch P1 of the first group of the first semiconductor fins 102 (see FIG. 16B). That is, the lower step of the stepped top surface profile of the portion 1002C is wider than the fin pitch P1. In some embodiments, the width of the portion 1004C is wider than the fin pitch P2 of the second group of the second semiconductor fins 104 (see FIG. 16B). That is, the lower step of the stepped top surface profile of the portion 1004C is wider than the fin pitch P2.

Figure 23:
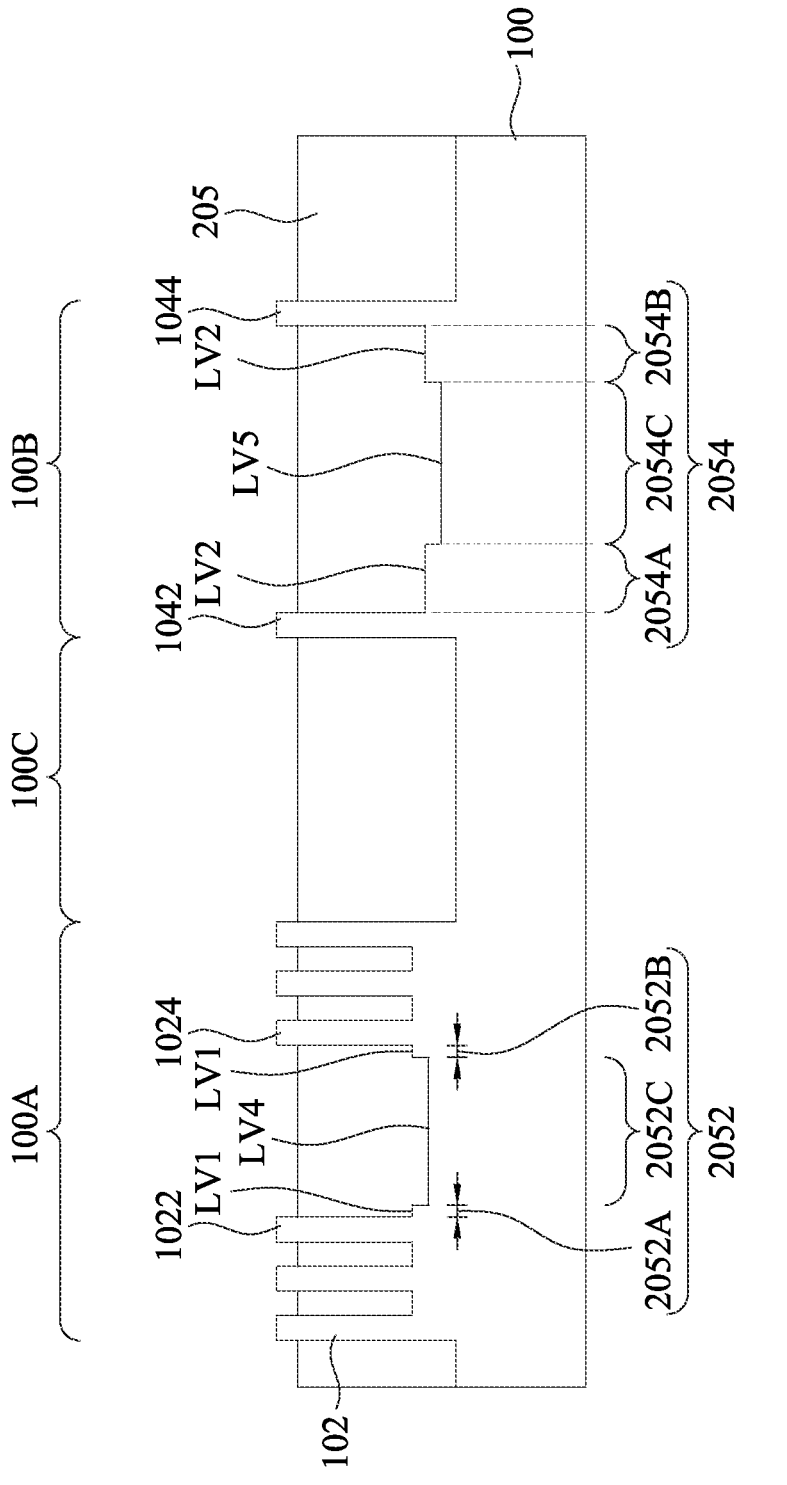

Reference is made to FIG. 23. FIG. 23 is similar to FIG. 10. Isolation structures 205 are formed over the substrate 100 and laterally surrounding the first semiconductor fins 102 and the second semiconductor fins 104, such that top portions of the first semiconductor fins 102 and the second semiconductor fins 104 protrude over the isolation structures 205. In some embodiments, the isolation structures 205 can also be referred to as shallow trench isolation (STI) structures 205.

In some embodiments, the isolation structures 205 may include a portion 2052 over the portion 1002 of the substrate 100 and a portion 2054 over the portion 1004 of the substrate 100. Accordingly, the portion 2052 of the isolation structures 205 may include a same width as the portion 1002 of the substrate 100, and the portion 2054 of the isolation structures 205 may include a same width as the portion 1004 of the substrate 100. In greater details, the portion 2052 of the isolation structures 205 is between the first semiconductor fins 1022 and 1024, and the portion 2054 of the isolation structures 205 is between the second semiconductor fins 1022 and 1024.

The portion 2052 of the isolation structure 205 includes first and second segments 2052A and 2052B, and a third segment 2052C between the first and second segments 2052A and 2052B. The bottom surfaces of the first and second segments 2052A and 2052B are at the level LV1, while the bottom surface of the third segment 2052C is at the level LV4 lower than the level LV1.

In some embodiments, the portion 2052 of the isolation structure 205 can also be referred to as a first isolation structure of the isolation structure 205. The first isolation structure includes a stepped bottom surface profile, which includes a lower step (e.g., LV4), two upper steps (e.g., LV1), and two step rises extending from opposite sides of the lower step to the upper steps.

Similarly, the portion 2054 of the isolation structure 205 includes first and second segments 2054A and 2054B, and a third segment 2054C between the first and second segments 2054A and 2054B. The bottom surfaces of the first and second segments 2054A and 2054B are at the level LV2, while the bottom surface of the third segment 2054C is at the level LV5 lower than the level LV2.

In some embodiments, the portion 2054 of the isolation structure 205 can also be referred to as a second isolation structure of the isolation structure 205. The first second isolation structure includes a stepped bottom surface profile, which includes a lower step (e.g., LV5), two upper steps (e.g., LV2), and two step rises extending from opposite sides of the lower step to the upper steps.

In some embodiments, the structure shown in FIG. 23 may undergo the processes as described in FIGS. 11A to 15B. That is, semiconductor devices may be formed over the first region 100A and the second region 100B of the substrate 100. The semiconductor devices may include the source/drain epitaxy structures 230A and 230B, the gate structures 250A and 250B. Other elements described in FIGS. 11A to 15B may also be formed over the structure shown in FIG. 23, and thus relevant details will not be repeated for brevity.

Figure 24:
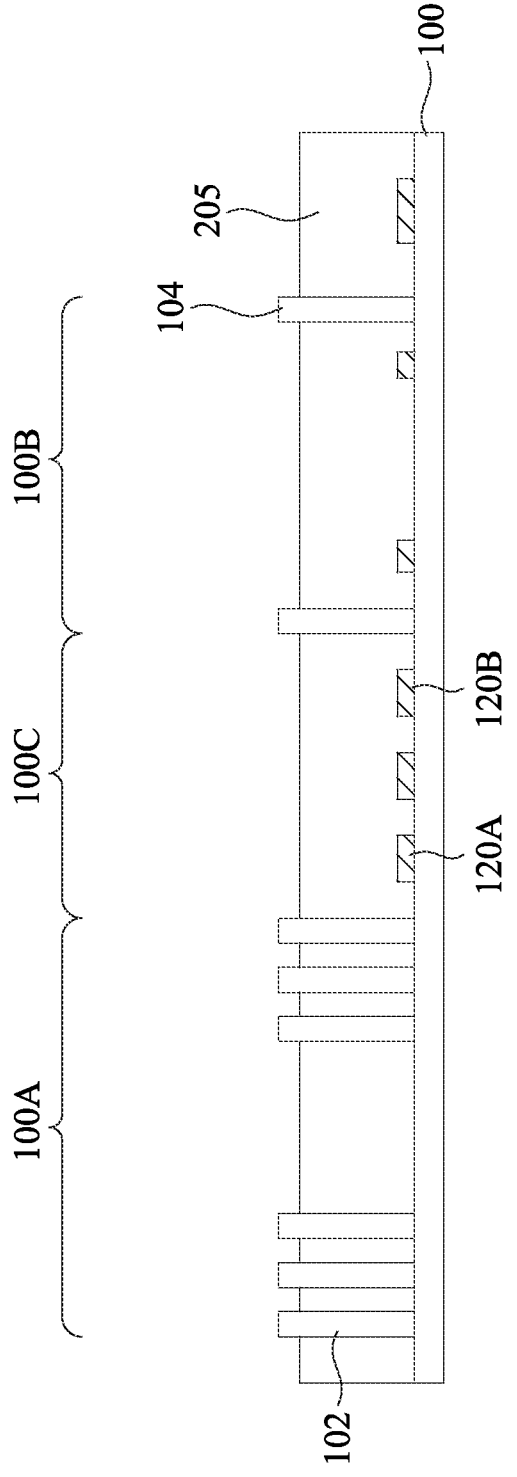
FIG. 24 illustrates a semiconductor device in accordance with some embodiments of the present disclosure.

FIG. 24 illustrates a semiconductor device in accordance with some embodiments of the present disclosure. FIG. 24 is similar to FIG. 10, the difference between FIG. 24 and FIG. 10 is that, portions of the mask strips 120A and 120B may remain after the removal process of the bottom layer 152 and the mask strips 120A and 120B. Accordingly, the mask strips 120A and 120B may be shorten, and thus top surfaces of the mask strips 120A and 120B may be lowered to a level below top surfaces of the first semiconductor fins 102 and the top surfaces of the second semiconductor fins 104. In some embodiments, the isolation structures 205 may cover the remaining mask strips 120A and 120B. In greater details, the isolation structures 205 may be in contact with top surface and opposite sidewalls of each of the remaining mask strips 120A and 120B. In some embodiments, the remaining mask strips 120A and 120B can also be referred to as polymer strips or polymer residues.

Figure 25:
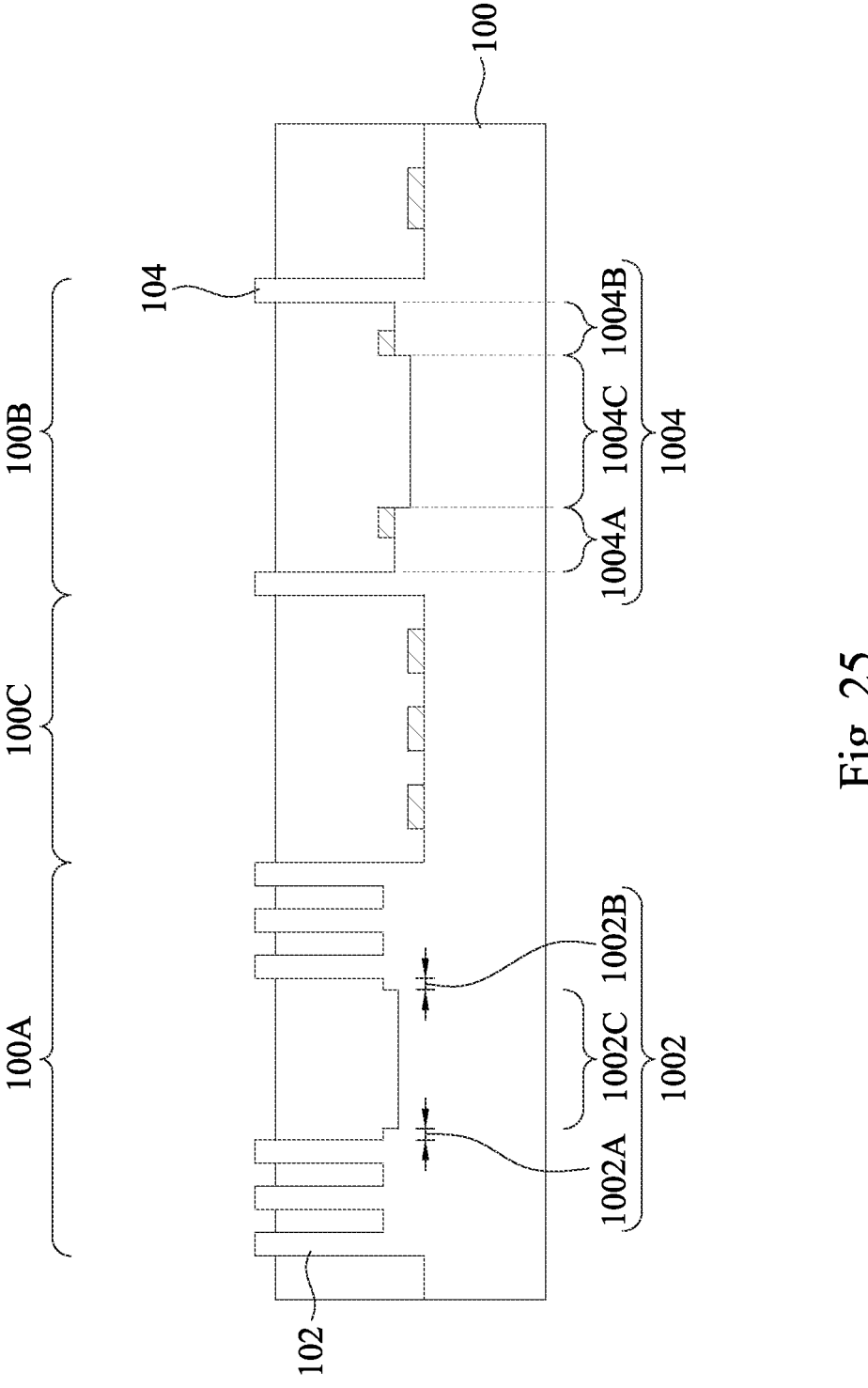
FIG. 25 illustrates a semiconductor device in accordance with some embodiments of the present disclosure.

FIG. 25 illustrates a semiconductor device in accordance with some embodiments of the present disclosure. FIG. 25 is similar to FIG. 23, the difference between FIG. 25 and FIG. 23 is that, portions of the mask strips 120A and 120B may remain after the removal process of the bottom layer 152 and the mask strips 120A and 120B. Accordingly, the mask strips 120A and 120B may be shorten, and thus top surfaces of the mask strips 120A and 120B may be lowered to a level below top surfaces of the first semiconductor fins 102 and the top surfaces of the second semiconductor fins 104. In some embodiments, the isolation structures 205 may cover the remaining mask strips 120A and 120B. In greater details, the isolation structures 205 may be in contact with top surface and opposite sidewalls of each of the remaining mask strips 120A and 120B.

In some embodiments, the remaining mask strips 120B are disposed over the first and second segments 1004A and 1004B of the portion 1004 of the substrate 100. In some embodiments, the region vertically above the third segment 1004C of the portion 1004 of the substrate 100 is free of the remaining mask strip. Moreover, the region vertically above the portion 1002 of the substrate 100 is free of the remaining mask strip.

FIGS. 26 to 32D illustrate a method in various stages of forming a semiconductor device in accordance with some embodiments of the present disclosure. It is noted that some elements described in FIGS. 26 to 32D are the same as or similar to the elements described in FIGS. 1A to 15B, such elements are labeled the same and relevant details will not be repeated for brevity. The difference between FIGS. 26 to 32D and 1A to 15B is that, the first group of first semiconductor fins 102 of FIG. 1B has been replaced with a first group of first fin structures 302, and the second group of second semiconductor fins 104 of FIG. 1B has been replaced with a second group of second fin structures 304.

Figure 26:
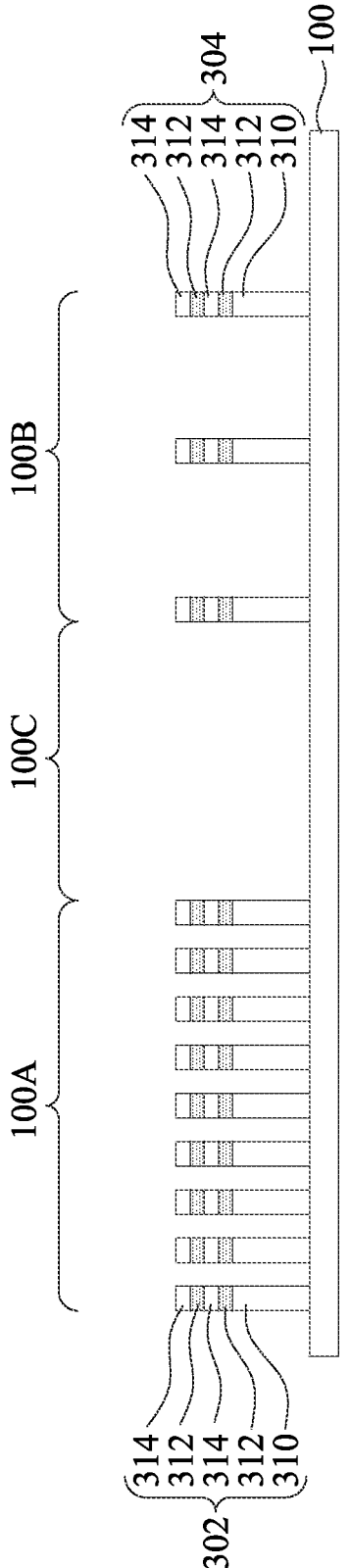
FIGS. 26 to 32D illustrate a method in various stages of forming a semiconductor device in accordance with some embodiments of the present disclosure.

As shown in FIG. 26, each of the first fin structures 302 and the second fin structures 304 include a semiconductor strip 310, and first and second semiconductor layers 312 and 314 alternately stacked over the semiconductor strip 310. In some embodiments, the second semiconductor layers 314 can also be referred to as nanostructures, nanosheets, or nanowires.

The first semiconductor layers 312 and the second semiconductor layers 314 may include different materials and/or components, such that the first semiconductor layers 312 and the second semiconductor layers 314 have different etching rates. In some embodiments, the first semiconductor layers 312 are made from SiGe. The germanium percentage (atomic percentage concentration) of the first semiconductor layers 312 is in the range between about 10 percent and about 20 percent, while higher or lower germanium percentages may be used. It is appreciated, however, that the values recited throughout the description are examples, and may be changed to different values. For example, the first semiconductor layers 312 may be $Si_{0.8}Ge_{0.2}$ or $Si_{0.9}Ge_{0.1}$, in which the proportion between Si and Ge may vary from embodiments, and the disclosure is not limited thereto. The second semiconductor layers 314 may be pure silicon layers that are free of germanium. The second semiconductor layers 314 may also be substantially pure silicon layers, for example, with a germanium percentage lower than about 1 percent. In some embodiments, the first semiconductor layers 312 have a higher germanium atomic percentage concentration than the second semiconductor layers 314. The first semiconductor layers 312 and the second semiconductor layers 314 may be formed by chemical vapor deposition (CVD), molecular beam epitaxy (MBE), or other suitable process(es). In some embodiments, the first semiconductor layers 312 and the second semiconductor layers 314 are formed by an epitaxy growth process, and thus the first semiconductor layers 312 and the second semiconductor layers 314 can also be referred to as epitaxial layers in this content.

Figure 27:
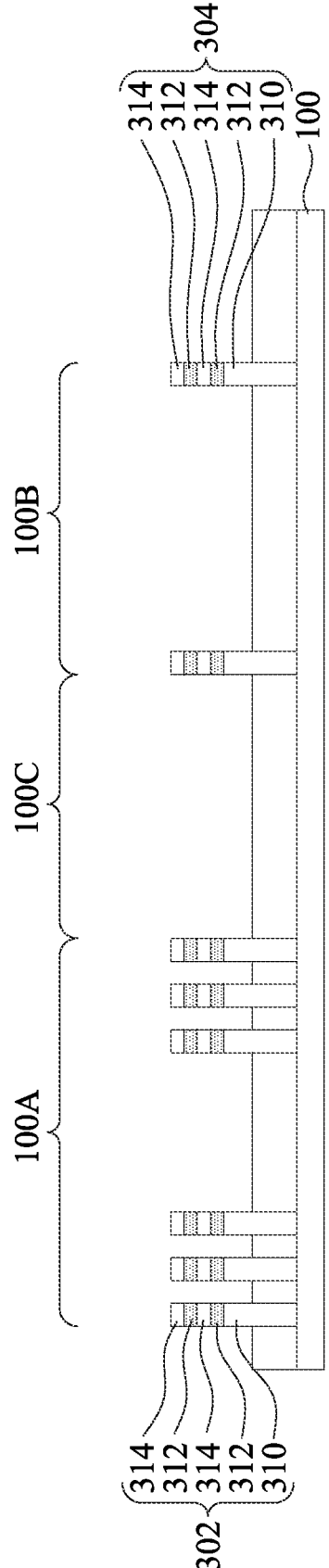

Reference is made to FIG. 27. The structure shown in FIG. 26 may undergo the fin-cut process as described with respect to FIGS. 1A to 15B, and the resulting structure is shown in FIG. 27. In greater details, some of the first fin structures 302 and the second fin structures 304 have been removed (or cut). Then, isolation structures 205 are formed over the substrate 100 and laterally surrounding the first fin structures 302 and the second fin structures 304. In some embodiments, the top surface of the isolation structures 205 may be lower than top surfaces of the semiconductor strips 310. Although not shown in FIG. 27, the structure of FIG. 27 may also include the remaining mask strips 120A and 120B as described in FIG. 24, and thus relevant details will not be repeated for brevity.

Figures 28A, 28B:
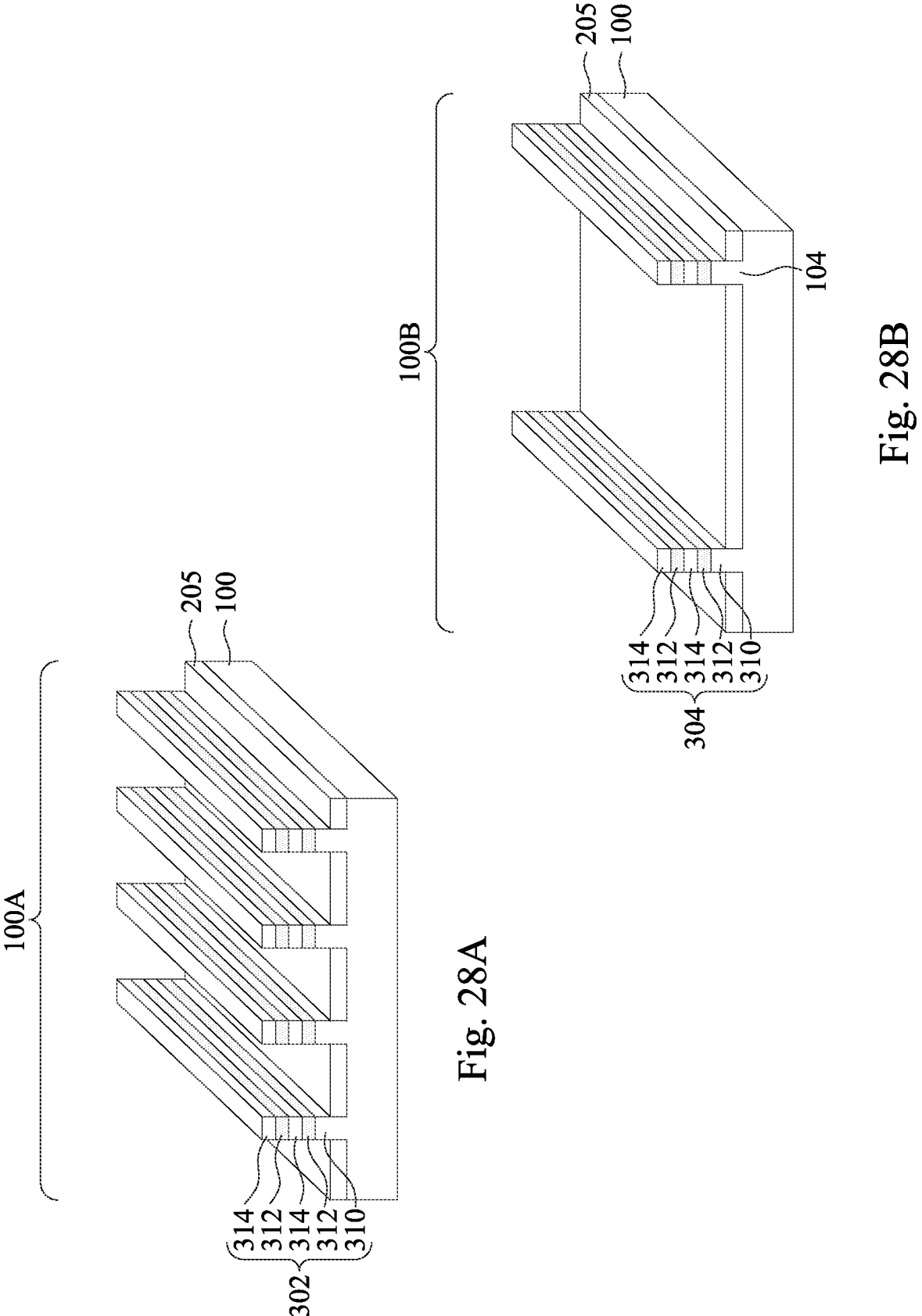

Reference is made to FIGS. 28A and 28B, in which FIGS. 28A and 28B are schematic views of different regions of a substrate. In greater details, FIG. 28A is a schematic view of the first region 100A of the substrate 100 in FIG. 27, and FIG. 28B is a schematic view of the second region 100B of the substrate 100 in FIG. 27. For example, first fin structures 302 are disposed over the first region 100A of the substrate 100, and second fin structures 304 are disposed over the second region 100B of the substrate 100, respectively.

Figures 29A, 29B:
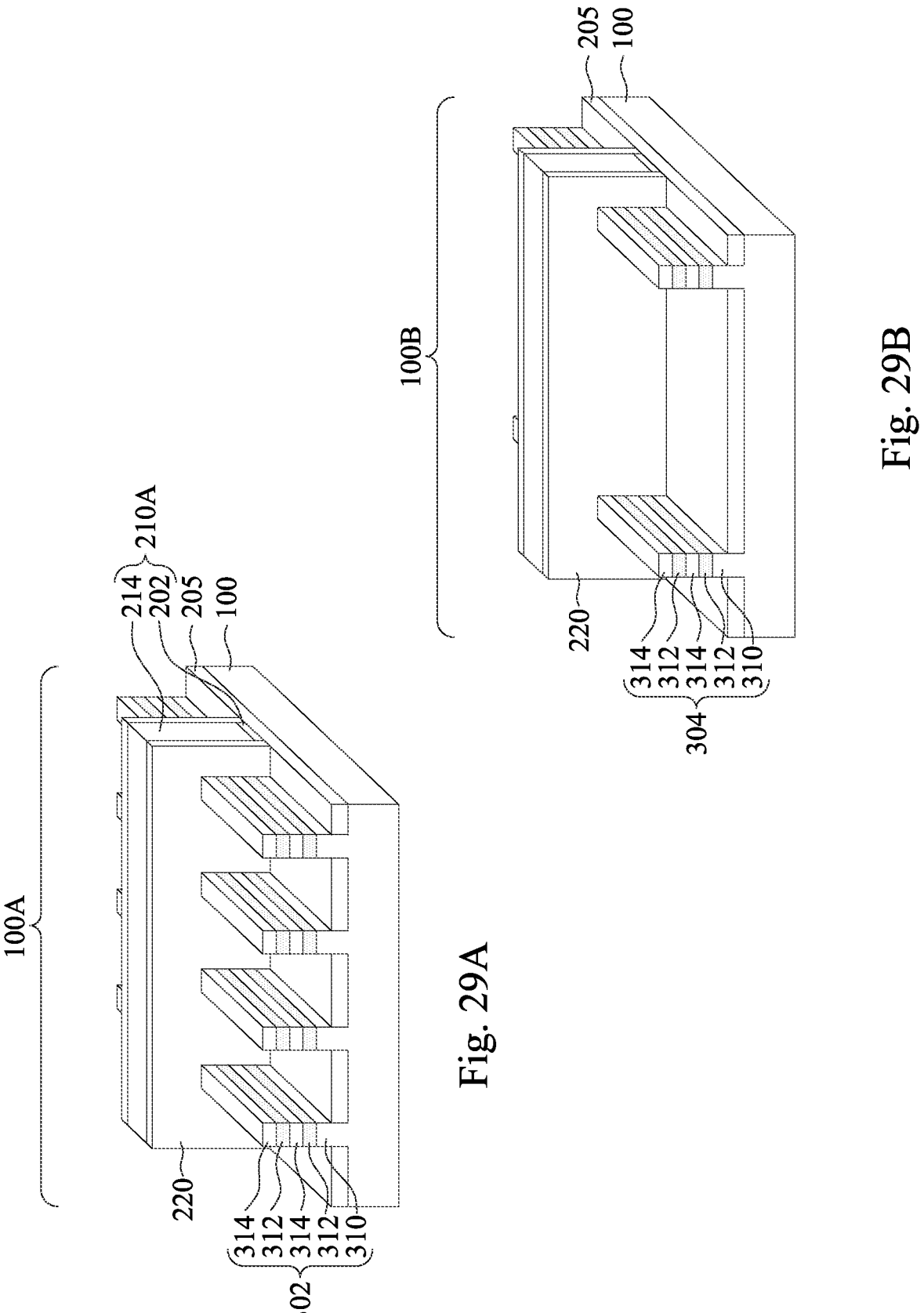

Reference is made to FIGS. 29A and 29B. Dummy gate structures 210A and 210B are formed over the first region 100A and the second region 100B of the substrate 100, respectively. In greater details, the dummy gate structures 210A is formed over the first region 100A of the substrate 100 and crossing the first fin structures 302, and the dummy gate structures 210B is formed over the second region 100B of the substrate 100 and crossing the second fin structures 304. In some embodiments, each of the dummy gate structures 210A and 210B includes a gate dielectric 212 and a gate electrode 214 over the gate dielectric 212. Gate spacers 220 are formed on opposite sidewalls of the dummy gate structures 210A and 210B, respectively.

Figures 30A, 30B:
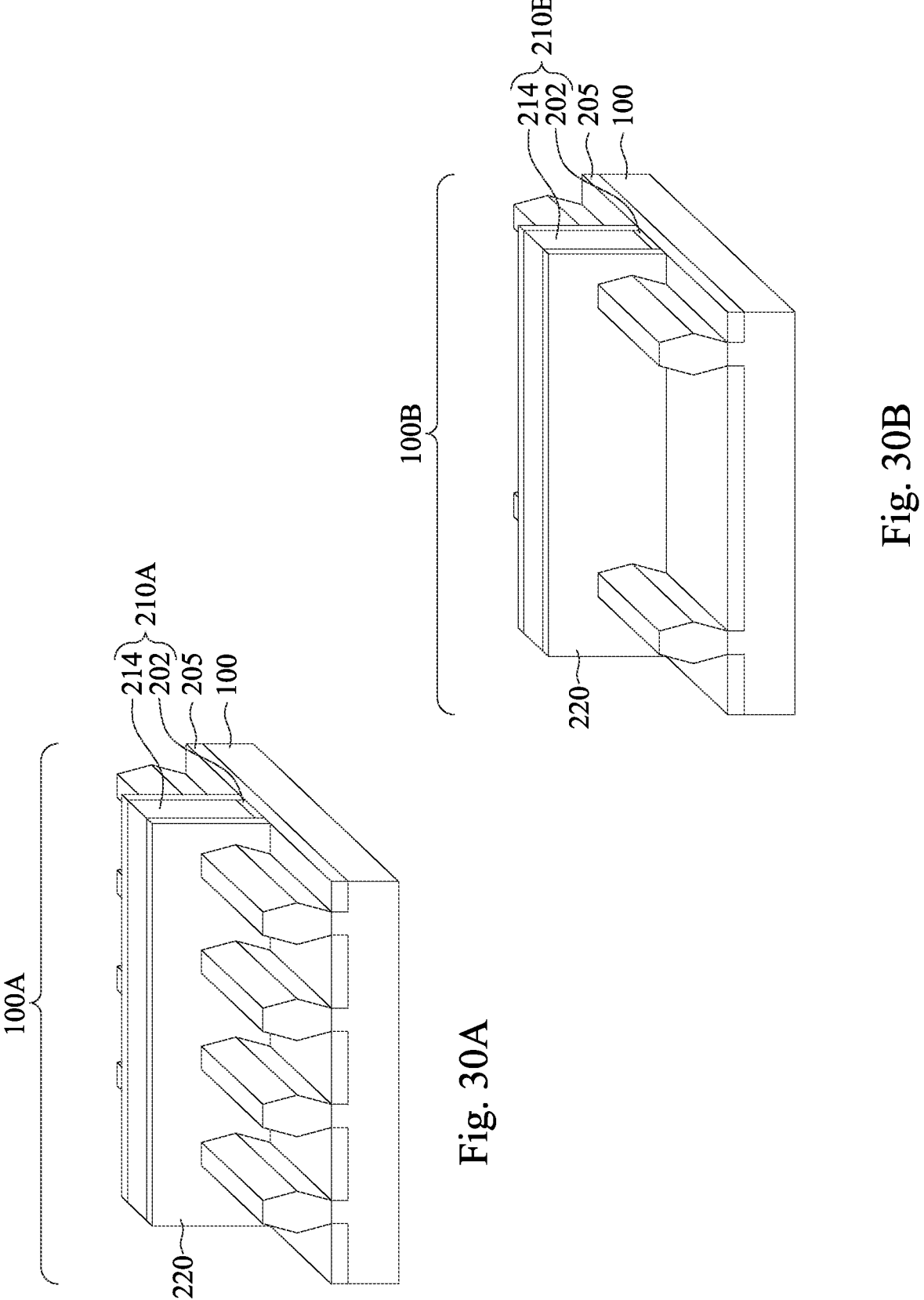

Reference is made to FIGS. 30A and 30B. The first and second fin structures 302 and 304 are recessed by using the dummy gate structures 210A and 210B and the gate spacers 220 as etch mask, so as to form recesses in the first and second fin structures 302 and 304, respectively. After the first and second first and second fin structures 302 and 304 are recessed, source/drain epitaxy structures 230A and 230B are formed over the recessed portions of the first and second fin structures 302 and 304, respectively. In greater details, the first and second semiconductor layers 312 and 314 exposed by the dummy gate structures 210A and 210B and the gate spacers 220 are removed, and the source/drain epitaxy structures 230A and 230B are formed on the remaining portions of the semiconductor strips 310 of the first and second fin structures 302 and 304, respectively.

Figures 31A, 31B:
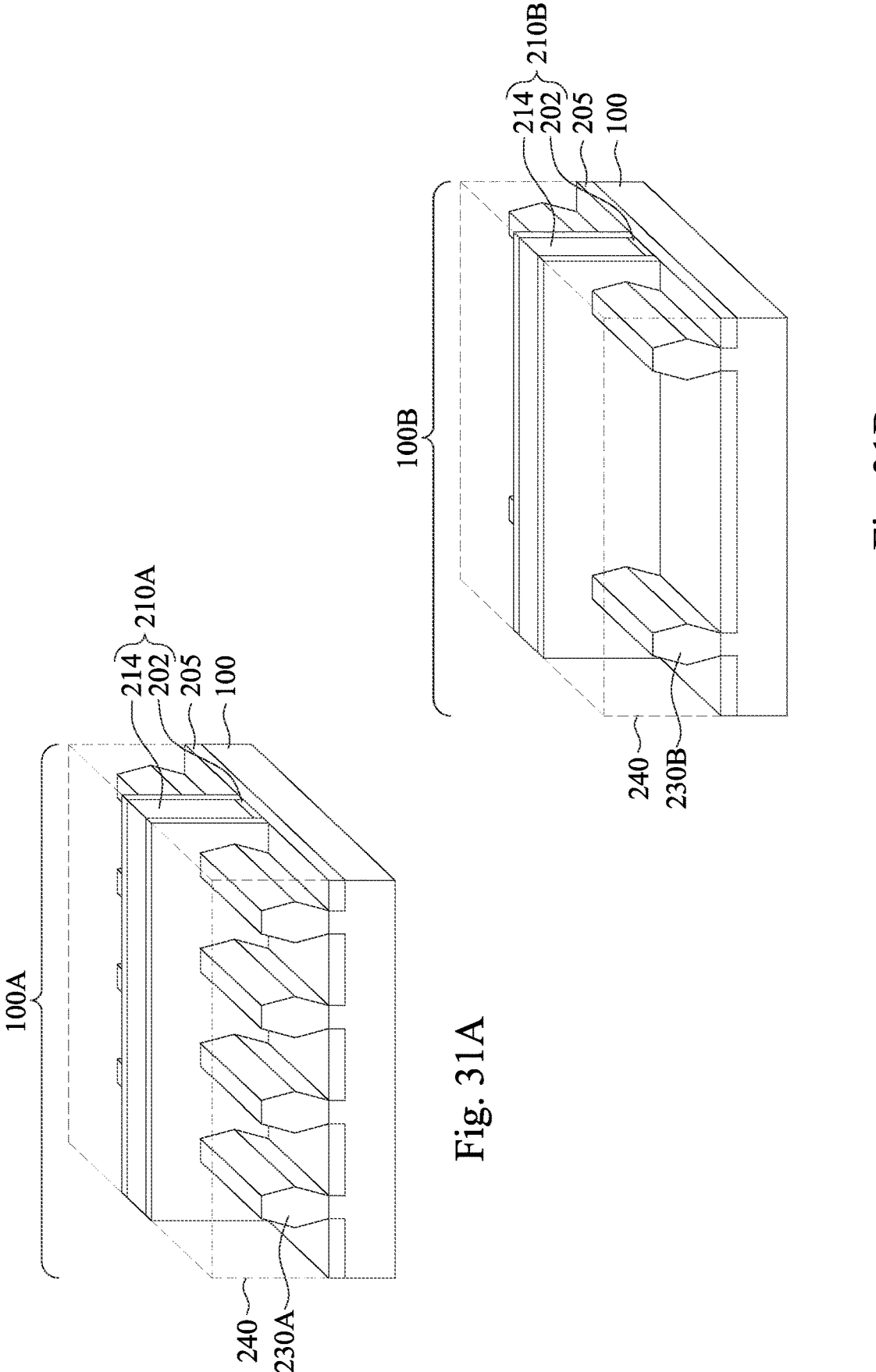

Reference is made to FIGS. 31A and 31B. An interlayer dielectric (ILD) layer 240 is deposited over the source/drain epitaxy structures 230A and 230B and laterally surrounding the dummy gate structures 210A and 210B.

Figures 32A, 32B:
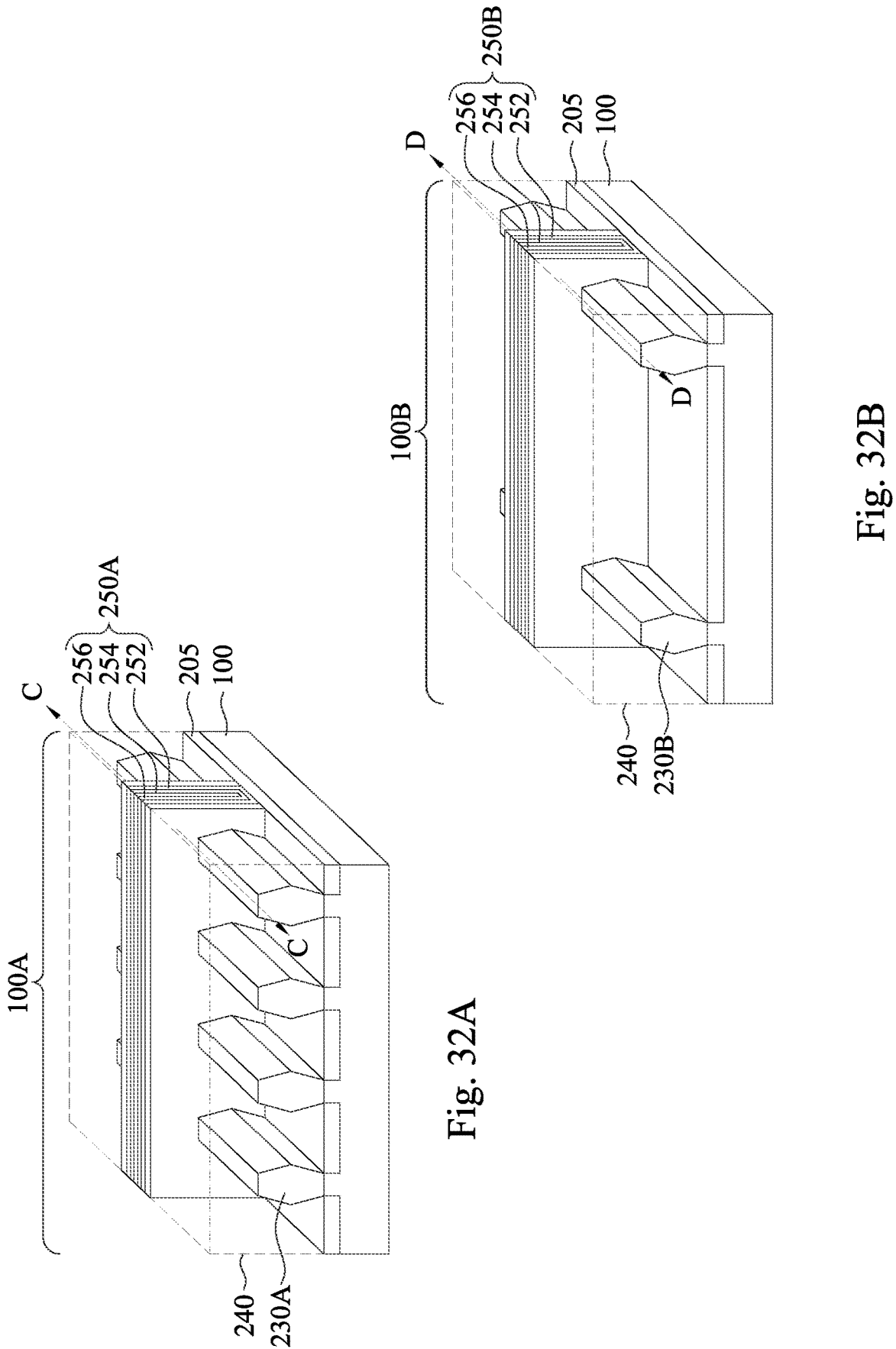
Figure 32D:
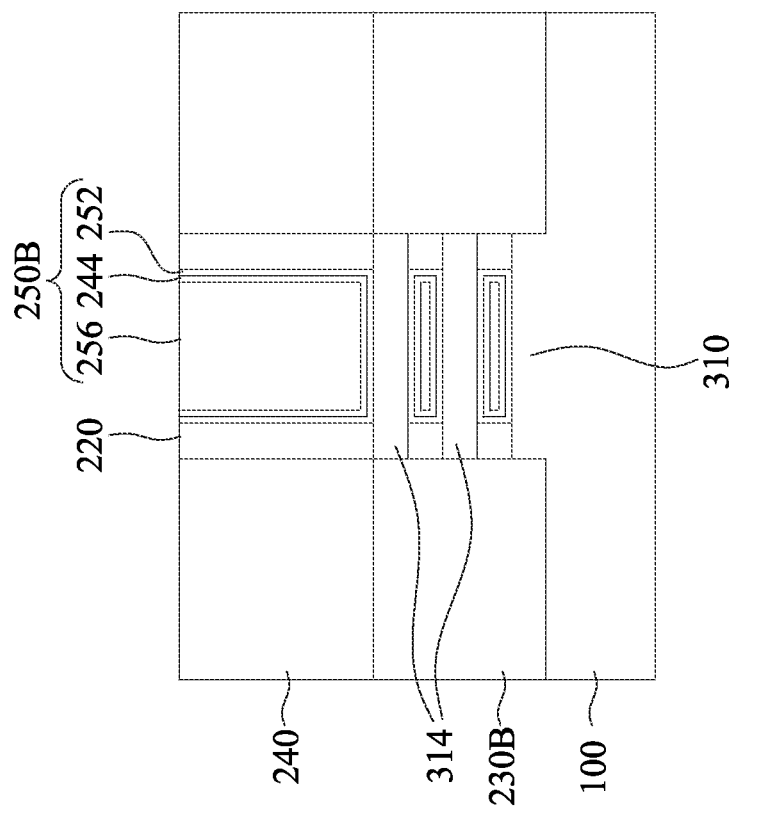
Figure 32C:
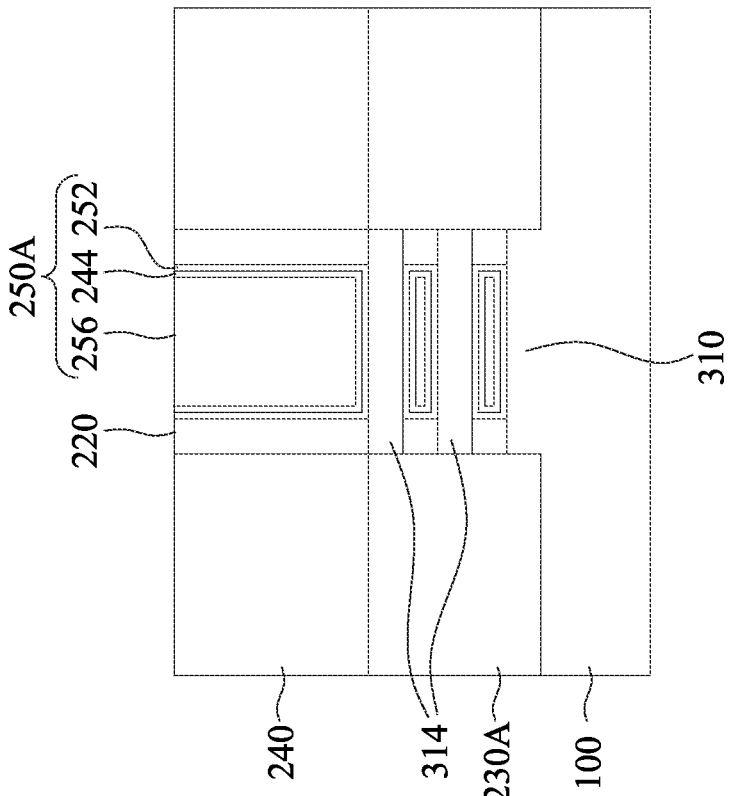

Reference is made to FIGS. 32A to 32D, in which FIG. 32C is a cross-sectional view along line C-C of FIG. 32A, and FIG. 32D is a cross-sectional view along line D-D of FIG. 32A. The dummy gate structures 210A and 210B (see FIGS. 31A and 31B) are removed to form gate trench between the gate spacers 220. In some embodiments, the dummy gate structures 210A and 210B may be removed by an anisotropic dry etch process. For example, the etching process may include a dry etch process using reaction gas(es) that selectively etch the dummy gate structures 210A and 210B at a faster rate than the ILD layer 240 or the gate spacers 220.

Next, the first semiconductor layers 312 of the first and second fin structures 302 and 304 are removed through the gate trench, such that portions of the second semiconductor layers 314 of the first and second fin structures 302 and 304 are suspended over the substrate 100. The first semiconductor layers 312 may be removed by performing an isotropic etching process such as wet etching or the like using etchants which are selective to the materials of the first semiconductor layers 312, while the second semiconductor layers 314 remain relatively unetched as compared to the first semiconductor layers 312. In embodiments where the first semiconductor layers 51 include, e.g., SiGe, and the second semiconductor layers 314 include, e.g., Si, tetramethylammonium hydroxide (TMAH), ammonium hydroxide (NH₄OH), or the like may be used to remove the first semiconductor layers 312.

After the removal of the first semiconductor layers 312, metal gate structures 250A and 250B are formed for replacement gates. In some embodiments, the gate structures 250A may wrap around the second semiconductor layers 312 within the first regions 100A of the substrate 100, and the gate structures 250B may wrap around the second semiconductor layers 312 within the second regions 100B of the substrate 100. In some embodiments, each of the metal gate structures 250A and 250B include a include a gate dielectric layer 252, a work function metal layer 254 over the gate dielectric layer 252, and a gate electrode 256 over the work function metal layer 254.

In some embodiments, first and second transistors are formed over the first and second regions 100A and 100B of the substrate 100 have a gate-all-around configuration. For example, the first transistors within the first region 100A of the substrate 100 each may include a gate structure 250A, source/drain epitaxy structures 230A, and the first semiconductor layers 314 (channel layers). On the other hand, the second transistors within the second region 100B of the substrate 100 each may include a gate structure 250B, source/drain epitaxy structures 230B, and the first semiconductor layers 314 (channel layers).

Figure 33:
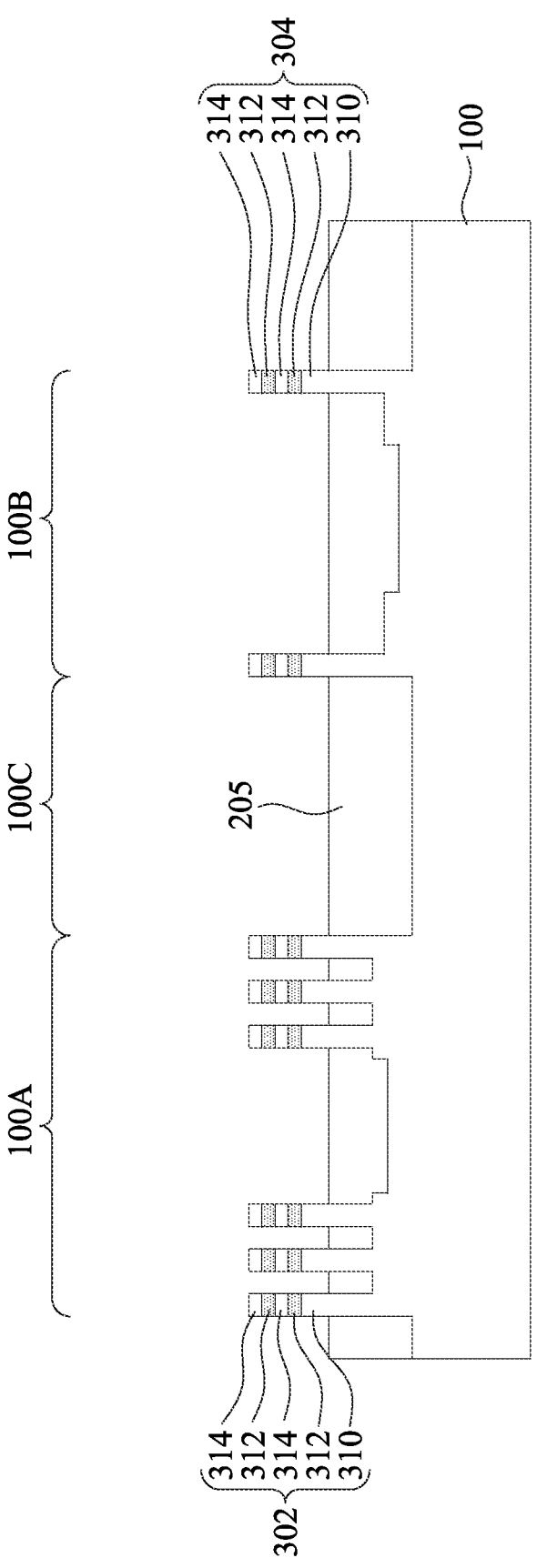
FIG. 33 illustrates a semiconductor device in accordance with some embodiments of the present disclosure.

FIG. 33 illustrates a semiconductor device in accordance with some embodiments of the present disclosure. FIG. 33 is similar to FIG. 23, the difference between FIG. 33 and FIG. 23 is that, the first group of first semiconductor fins 102 of FIG. 23 has been replaced with a first group of first fin structures 302, and the second group of second semiconductor fins 104 of FIG. 23 has been replaced with a second group of second fin structures 304. The substrate 100 and the isolation structures 205 may include similar profile as the substrate 100 and the isolation structures 205 described in FIG. 23, and thus relevant details will not be repeated for brevity. Moreover, although not shown in FIG. 33, the structure of FIG. 33 may also include the remaining mask strips 120A and 120B as described in FIG. 25, and thus relevant details will not be repeated for brevity.

Based on the above discussions, it can be seen that the present disclosure offers advantages. It is understood, however, that other embodiments may offer additional advantages, and not all advantages are necessarily disclosed herein, and that no particular advantage is required for all embodiments. Embodiments of the present disclosure provide a method by forming mask strips over regions of a substrate with lower pattern densities. The mask strips may balance the pattern densities over different regions of the substrate. Accordingly, the mask layer for a fin-cut process performed in later steps can be deposited with a uniform thickness over different regions of the substrate. As a result, the quality of the mask layer can be improved, which will facilitate the fin-cut process, and will also improve the device performance.

In some embodiments of the present disclosure, a semiconductor device includes a substrate having a first region and a second region. A first group of semiconductor fins are over the first region of the substrate, in which in a cross-sectional view, the substrate includes a first stepped profile between two of the first group of semiconductor fins, and the first stepped profile comprises a first lower step, two first upper steps, and two first step rises extending from opposite sides of the first lower step to the first upper steps. A second group of semiconductor fins are over the second region of the substrate, a fin pitch of the first group of semiconductor fins being less than a fin pitch of the second group of semiconductor fins, in which in the cross-sectional view, the substrate includes a second stepped profile between two of the second group of semiconductor fins, and the second stepped profile comprises a second lower step, two second upper steps, and two second step rises extending from opposite sides of the second lower step to the second upper steps, in which the second upper steps are wider than the first upper steps in the cross-sectional view. A first transistor is over the first group of semiconductor fins. A second transistor is over the second group of semiconductor fins.

In some embodiments, the substrate further comprises a third region between the first and second regions, and in which a top surface of the substrate within the third region is lower than the first lower stepped of the first stepped profile of the substrate.

In some embodiments, the first upper steps of the first stepped profile are higher than the second upper steps of the second stepped profile.

In some embodiments, the first lower step of the first stepped profile is higher than the second lower step of the second stepped profile.

In some embodiments, the first lower step of the first stepped profile has a width greater than the fin pitch of the first group of semiconductor fins.

In some embodiments, a lateral width of the first stepped profile of the substrate is narrower than a lateral width of the second stepped profile of the substrate.

In some embodiments, the fin pitch of the first group of semiconductor fins is about 18 nm to about 55 nm.

In some embodiments of the present disclosure, a semiconductor device includes a substrate having a first region and a second region. A first group of semiconductor fins are over the first region of the substrate. A second group of semiconductor fins are over the second region of the substrate. Isolation structures are over the substrate and laterally surrounding the first group of semiconductor fins and the second group of semiconductor fins, the isolation structures including a first isolation structure within the first region of the substrate and between two of the first group of semiconductor fins and a second isolation structure within the second region of the substrate and between two of the second group of semiconductor fins, in which the first isolation structure has a first stepped bottom surface, and the first stepped bottom surface comprises a first lower step, two first upper steps, and two first step rises extending from opposite sides of the first lower step to the first upper steps, and the second isolation structure has a second stepped bottom surface, and the second stepped bottom surface comprises a second lower step, two second upper steps, and two second step rises extending from opposite sides of the second lower step to the second upper steps, in which the second upper steps have longer step runs than the first upper steps. A first transistor is over the first group of semiconductor fins. A second transistor is over the second group of semiconductor fins.

In some embodiments, a fin pitch of the first group of semiconductor fins is less than a fin pitch of the second group of semiconductor fins.

In some embodiments, the semiconductor device further includes polymer strips vertically between the second isolation structure and the substrate.

In some embodiments, the first isolation structure and the substrate are free of the polymer strips therebetween.

In some embodiments, the isolation structures further includes a third isolation structure within a third region of the substrate between the first and second regions of the substrate, and in which a bottom surface of the third isolation structure is lower than the first lower step of the first stepped bottom surface of the first isolation structure.

In some embodiments, the semiconductor device further includes polymer strips vertically between the third isolation structure and the substrate.

In some embodiments of the present disclosure, a method includes forming a first group of semiconductor fins over a first region of a substrate and a second group of semiconductor fins over a second region of the substrate; forming a first mask layer covering the first group and the second group of semiconductor fins; patterning the first mask layer to form first mask strips over the second region of the substrate, such that the first mask strips and the second group of semiconductor fins are alternately arranged along a lateral direction; forming a second mask layer covering the first and second groups of semiconductor fins, and the first mask strips; patterning the second mask layer to form a first opening exposing one or more of the first group of semiconductor fins, and a second opening exposing one or more of the second group of semiconductor fins; and removing the exposed one or more of the first group of semiconductor fins and the exposed one or more of the second group of semiconductor fins.

In some embodiments, a distance between adjacent two of the first group of semiconductor fins is less than a distance between adjacent two of the second group of semiconductor fins.

In some embodiments, the first mask layer is made of a negative photoresist.

In some embodiments, each of the first group of semiconductor fins is wider than each of the second group of semiconductor fins.

In some embodiments, the first mask layer has a first portion covering the first group of semiconductor fins and a second portion covering the second group of semiconductor fins, and a thickness of the first portion of the first mask layer is greater than a thickness of the second portion of the first mask layer.

In some embodiments, the first mask layer has a third portion over a fin-free region of the substrate, and in which a smallest thickness of the third portion of the first mask layer is smaller than the thickness of the first portion of the first mask layer and the thickness of the second portion of the first mask layer.

In some embodiments, patterning the first mask layer is performed to form second mask strips over the fin-free region of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a first group of semiconductor fins over a first region of a substrate and a second group of semiconductor fins over a second region of the substrate;

forming a first mask layer covering the first group and the second group of semiconductor fins;

patterning the first mask layer to form first mask strips over the second region of the substrate, such that the first mask strips and the second group of semiconductor fins are alternately arranged along a lateral direction;

forming a second mask layer covering the first and second groups of semiconductor fins, and the first mask strips;

patterning the second mask layer to form a first opening exposing one or more of the first group of semiconductor fins, and a second opening exposing one or more of the second group of semiconductor fins; and removing the exposed one or more of the first group of semiconductor fins and the exposed one or more of the second group of semiconductor fins.

2. The method of claim 1, wherein a distance between adjacent two of the first group of semiconductor fins is less than a distance between adjacent two of the second group of semiconductor fins.

3. The method of claim 1, wherein the first mask layer is made of a negative photoresist.

4. The method of claim 1, wherein each of the first group of semiconductor fins is wider than each of the second group of semiconductor fins.

5. The method of claim 1, wherein the first mask layer has a first portion covering the first group of semiconductor fins and a second portion covering the second group of semiconductor fins, and a thickness of the first portion of the first mask layer is greater than a thickness of the second portion of the first mask layer.

6. The method of claim 5, wherein the first mask layer has a third portion over a fin-free region of the substrate, and wherein a smallest thickness of the third portion of the first mask layer is smaller than the thickness of the first portion of the first mask layer and the thickness of the second portion of the first mask layer.

7. The method of claim 6, wherein patterning the first mask layer is performed to form second mask strips over the fin-free region of the substrate.

8. The method of claim 1, further comprising removing the first mask strips and the second mask layer after removing the exposed one or more of the first group of semiconductor fins and the exposed one or more of the second group of semiconductor fins.

9. The method of claim 1, wherein patterning the second mask layer comprises removing portions of the first mask strips.

10. A method, comprising:

forming a first group of semiconductor fins over a first region of a substrate;

forming a second group of semiconductor fins over a second region of the substrate;

forming a first mask layer covering the first group and the second group of semiconductor fins;

patterning the first mask layer to form first mask strips over a fin-free region of the substrate that is free of semiconductor fins;

forming a second mask layer covering the first and second groups of semiconductor fins, and the first mask strips;

patterning the second mask layer to form a first opening exposing one or more of the first group of semiconductor fins, and a second opening exposing one or more of the second group of semiconductor fins; and removing the exposed one or more of the first group of semiconductor fins and the exposed one or more of the second group of semiconductor fins.

11. The method of claim 10, wherein the first mask layer has a concave top surface over the fin-free region.

12. The method of claim 11, wherein a top surface of the first mask layer is more curved over the fin-free region than over the first and second regions.

13. The method of claim 11, wherein a distance between adjacent two of the first group of semiconductor fins is less than a distance between adjacent two of the second group of semiconductor fins, and wherein patterning the first mask layer to form the first mask strips is performed such that one of the first mask strips closest to the first group of semiconductor fins has a greater height than the other first mask strips.

14. The method of claim 10, wherein patterning the first mask layer is performed to form second mask strips in the second region of the substrate, and wherein the second mask strips and the second group of semiconductor fins are alternately arranged along a lateral direction.

15. The method of claim 10, wherein during removing the exposed one or more of the first group of semiconductor fins and the exposed one or more of the second group of semiconductor fins, an entirety of the first mask strips is protected by the second mask layer.

16. A method, comprising:

forming a first group of semiconductor fins over a first region of a substrate;

forming a second group of semiconductor fins over a second region of the substrate, wherein a distance between adjacent two of the first group of semiconductor fins is less than a distance between adjacent two of the second group of semiconductor fins;

forming first mask strips over the second region of the substrate, such that the first mask strips and the second group of semiconductor fins are alternately arranged along a lateral direction;

forming second mask strips over a fin-free region of the substrate, such that the second mask strips are between the first group of semiconductor fins and the second group of semiconductor fins;

after forming the first and second mask strips, forming a patterned mask exposing one or more of the first group of semiconductor fins and one or more of the second group of semiconductor fins; and removing the exposed one or more of the first group of semiconductor fins and the exposed one or more of the second group of semiconductor fins.

17. The method of claim 16, wherein a width of the first mask strips is greater than a width of the second mask strips.

18. The method of claim 16, wherein a width of the first mask strips and a width of the second mask strips are greater than a width of the first group and the second group of semiconductor fins.

19. The method of claim 16, wherein top surfaces of the first mask strips are higher than top surfaces of the second group of semiconductor fins.

20. The method of claim 14, wherein a first one of the second mask strips has a top surface higher than top surfaces of the second group of semiconductor fins, and a second one of the second mask strips has a top surface lower than the top surfaces of the second group of semiconductor fins.

* * * * *